United States Patent
Yang et al.

(10) Patent No.: US 12,068,811 B2
(45) Date of Patent: Aug. 20, 2024

(54) LDPC BASE GRAPH SELECTION SYSTEMS AND METHODS

(71) Applicant: QUALCOMM Incorporated, San Diego, CA (US)

(72) Inventors: Wei Yang, San Diego, CA (US); Jing Jiang, San Diego, CA (US); Danlu Zhang, San Diego, CA (US); Gabi Sarkis, San Diego, CA (US); Runxin Wang, San Diego, CA (US); Hwan Joon Kwon, San Diego, CA (US); Krishna Kiran Mukkavilli, San Diego, CA (US); Tingfang Ji, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/819,528

(22) Filed: Aug. 12, 2022

(65) Prior Publication Data

US 2024/0056133 A1    Feb. 15, 2024

(51) Int. Cl.
*H04B 7/0413* (2017.01)
*H03M 13/11* (2006.01)
(Continued)

(52) U.S. Cl.
CPC ...... *H04B 7/0413* (2013.01); *H03M 13/1102* (2013.01); *H04L 1/0057* (2013.01); *H04L 5/001* (2013.01); *H04L 5/0046* (2013.01); *H04L 5/0057* (2013.01); *H04L 1/0003* (2013.01); *H04L 1/0009* (2013.01)

(58) Field of Classification Search
CPC ... H04B 7/0413; H04L 1/0009; H04L 1/0067; H04L 1/0057; H04L 5/001; H04L 1/0046; H04L 1/0003
See application file for complete search history.

(56) References Cited

U.S. PATENT DOCUMENTS

| 11,552,728 B2 * | 1/2023 | Sandberg ............. H03M 13/116 |
| 2018/0226989 A1 | 8/2018 | Soriaga et al. |

(Continued)

FOREIGN PATENT DOCUMENTS

| EP | 3522379 A1 | 8/2019 |
| EP | 3609101 A1 | 2/2020 |

(Continued)

OTHER PUBLICATIONS

International Search Report and Written Opinion—PCT/US2023/029151—ISA/EPO—Oct. 4, 2023.

*Primary Examiner* — Rahel Guarino
(74) *Attorney, Agent, or Firm* — Guang Yu Zhang; Procopio, Cory, Hargreaves & Savitch LLP

(57) ABSTRACT

A first device may select a base graph from a plurality of base graphs based on one or more of (a) a decoding complexity of a second device, (b) a device category of the second device, (c) a capability of the second device, (d) a decoder mode of the second device, (e) a receiver complexity of the second device, (f) a receiver mode of the second device, (g) a power consumption of the second device, (h) a power mode of the second device, or (i) an indication from the second device. The first device may output an LDPC coded transmission to the second device based on the selected base graph.

30 Claims, 15 Drawing Sheets

(51) Int. Cl.
*H04L 1/00* (2006.01)
*H04L 5/00* (2006.01)

(56) References Cited

U.S. PATENT DOCUMENTS

2019/0013900 A1* 1/2019 Patel .................... H04L 1/0057
2019/0037437 A1   1/2019 Sun et al.
2022/0377585 A1* 11/2022 Chen ........................ H04L 5/16

FOREIGN PATENT DOCUMENTS

WO    2019038698 A1   2/2019
WO    2019095336 A1   5/2019

* cited by examiner

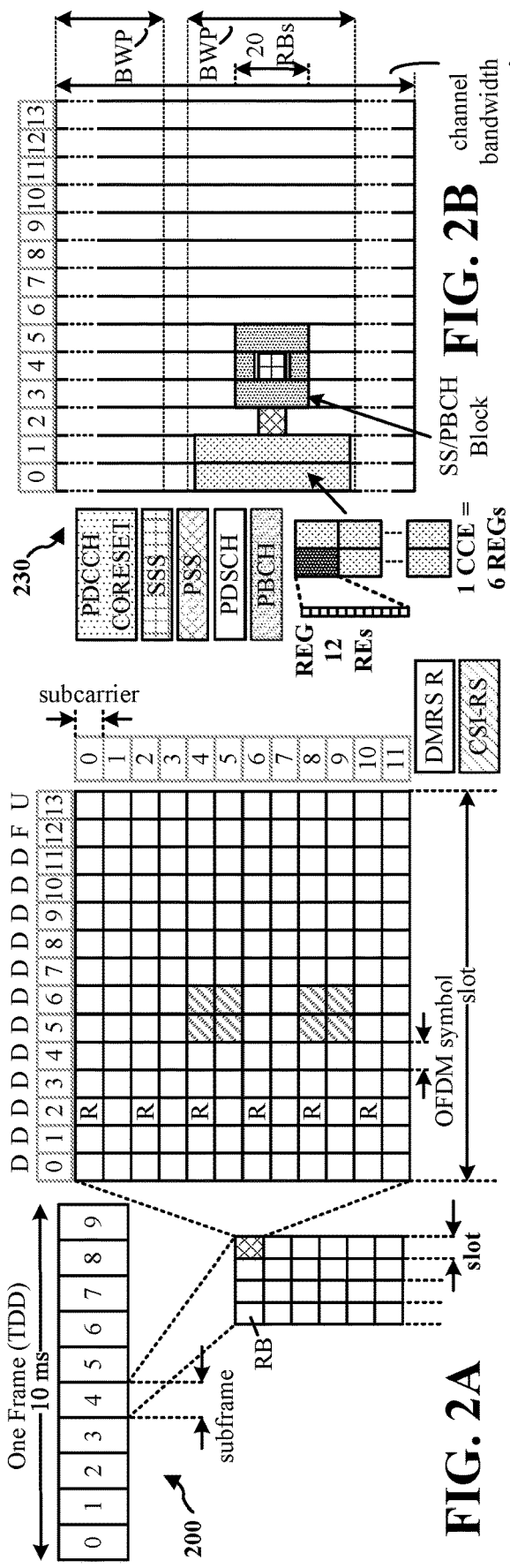
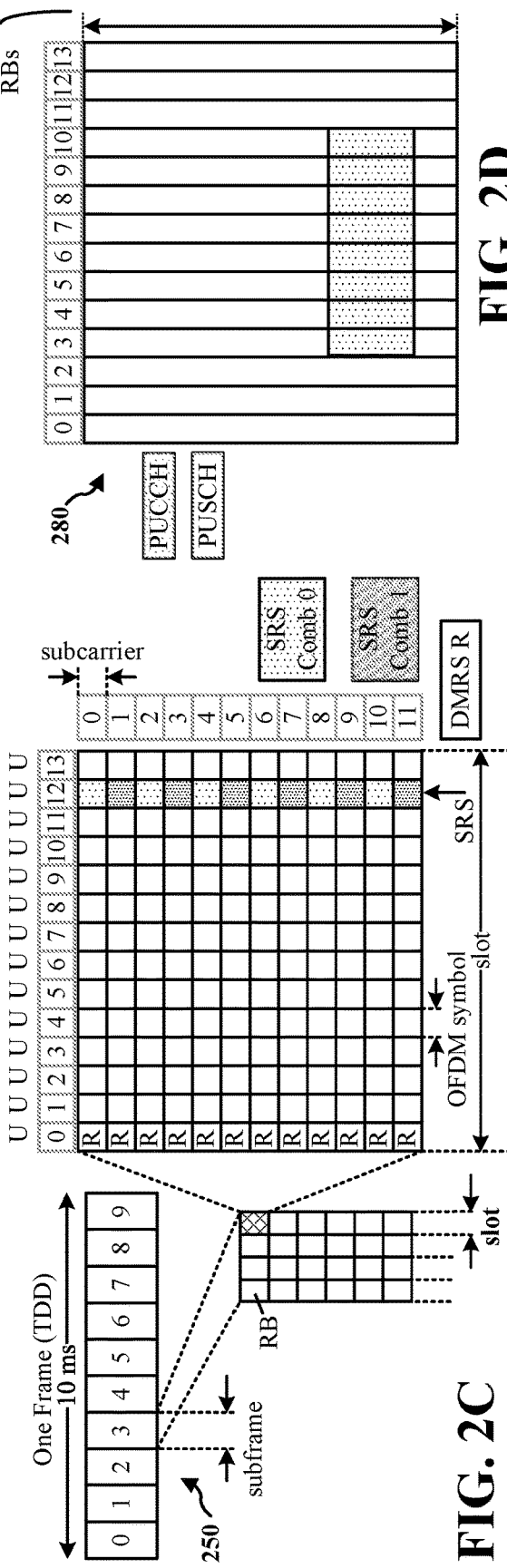
FIG. 2A
FIG. 2B
FIG. 2C
FIG. 2D

LDPC BASE GRAPH SELECTION SYSTEMS AND METHODS

TECHNICAL FIELD

The present disclosure relates generally to communication systems, and more particularly, to base graph selection for low density parity check (LDPC) code designs.

INTRODUCTION

Wireless communication systems are widely deployed to provide various telecommunication services such as telephony, video, data, messaging, and broadcasts. Typical wireless communication systems may employ multiple-access technologies capable of supporting communication with multiple users by sharing available system resources. Examples of such multiple-access technologies include code division multiple access (CDMA) systems, time division multiple access (TDMA) systems, frequency division multiple access (FDMA) systems, orthogonal frequency division multiple access (OFDMA) systems, single-carrier frequency division multiple access (SC-FDMA) systems, and time division synchronous code division multiple access (TD-SCDMA) systems.

These multiple access technologies have been adopted in various telecommunication standards to provide a common protocol that enables different wireless devices to communicate on a municipal, national, regional, and even global level. An example telecommunication standard is 5G New Radio (NR). 5G NR is part of a continuous mobile broadband evolution promulgated by Third Generation Partnership Project (3GPP) to meet new requirements associated with latency, reliability, security, scalability (e.g., with Internet of Things (IoT)), and other requirements. 5G NR includes services associated with enhanced mobile broadband (eMBB), massive machine type communications (mMTC), and ultra-reliable low latency communications (URLLC). Some aspects of 5G NR may be based on the 4G Long Term Evolution (LTE) standard. There exists a need for further improvements in 5G NR technology. These improvements may also be applicable to other multi-access technologies and the telecommunication standards that employ these technologies.

BRIEF SUMMARY

The following presents a simplified summary of one or more aspects in order to provide a basic understanding of such aspects. This summary is not an extensive overview of all contemplated aspects. This summary neither identifies key or critical elements of all aspects nor delineates the scope of any or all aspects. Its sole purpose is to present some concepts of one or more aspects in a simplified form as a prelude to the more detailed description that is presented later.

In an aspect of the disclosure, a method, a computer-readable medium, and an apparatus are provided. The apparatus may have a memory and at least one processor coupled to the memory at a first device. Based at least in part on information stored in the memory, the at least one processor may be configured to select a base graph from a plurality of base graphs based on information associated with a second device. The information associated with the second device may include at least one of (a) a decoding complexity of a second device, (b) a device category of the second device, (c) a capability of the second device, (d) a decoder mode of the second device, (e) a receiver complexity of the second device, (f) a receiver mode of the second device, (g) a power consumption of the second device, (h) a power mode of the second device, or (i) an indication from the second device. Based at least in part on information stored in the memory, the at least one processor may be further configured to output a low density parity check (LDPC) coded transmission to the second device based on the selected base graph.

In an aspect of the disclosure, a method, a computer-readable medium, and an apparatus are provided. The apparatus may have a memory and at least one processor coupled to the memory at a second device. Based at least in part on information stored in the memory, the at least one processor may be configured to select a base graph from a plurality of base graphs based on information associated with the second device. The information associated with the second device may include at least one of (a) a decoding complexity of the second device, (b) a device category of the second device, (c) a capability of the second device, (d) a decoder mode of the second device, (e) a receiver complexity of the second device, (f) a receiver mode of the second device, (g) a power consumption of the second device, (h) a power mode of the second device, (i) an indication from the second device, (j) a first bandwidth of a component carrier (CC), or (k) a second bandwidth of a transmission. Based at least in part on information stored in the memory, the at least one processor may be further configured to receive an LDPC coded transmission from a first device based on the selected base graph.

To the accomplishment of the foregoing and related ends, the one or more aspects include the features hereinafter fully described and particularly pointed out in the claims. The following description and the drawings set forth in detail certain illustrative features of the one or more aspects. These features are indicative, however, of but a few of the various ways in which the principles of various aspects may be employed.

BRIEF DESCRIPTION OF THE DRAWINGS

FIG. 2A is a diagram illustrating an example of a first frame, in accordance with various aspects of the present disclosure.

FIG. 2B is a diagram illustrating an example of DL channels within a subframe, in accordance with various aspects of the present disclosure.

FIG. 2C is a diagram illustrating an example of a second frame, in accordance with various aspects of the present disclosure.

FIG. 2D is a diagram illustrating an example of UL channels within a subframe, in accordance with various aspects of the present disclosure.

DETAILED DESCRIPTION

Figure 1:
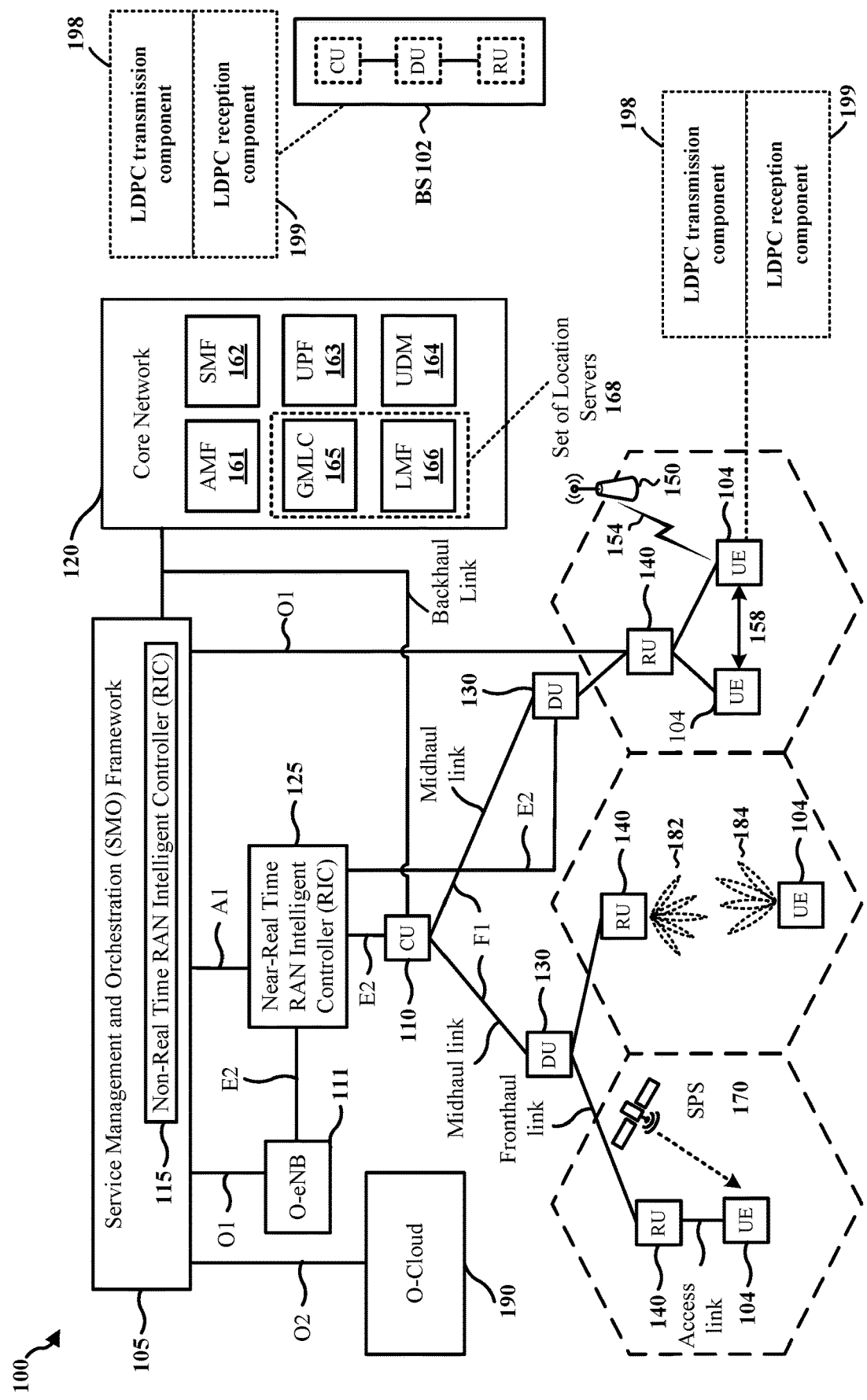
FIG. 1 is a diagram illustrating an example of a wireless communications system and an access network.

Wireless devices, such as UEs and network entities (e.g., base stations, components of base stations) may be configured to support higher throughput. Improving the throughput for wireless devices may use additional computing capability at a receiver. For example, doubling a throughput may use double the modem area and energy consumption of a receiving device having the same processing node size. It may be advantageous to enable wireless devices that support higher throughput to use transmitter and/or receiver algorithms that have less computation complexity (e.g., per bit), than transmissions that use lower throughput. Lower complexity LDPC decoders may use less energy consumption, but they may also have degraded performance. Low performing LDPC decoders may result in failed received transmissions. Thus, aspects presented herein help to reduce the complexity of an LDPC decoder while maintaining performance of the LDPC decoder.

A base graph for an LDPC decoder may be selected by a transmitting wireless device based upon one or more configuration parameters of a receiving wireless device. For example, a transmitting device may select a base graph from a plurality of base graphs based on information associated with a second device. The information associated with the second device may include at least one of (a) a decoding complexity of a receiving device, (b) a device category of the receiving device, (c) a capability of the receiving device, (d) a decoder mode of the receiving device, (e) a receiver complexity of the receiving device, (f) a receiver mode of the receiving device, (g) a power consumption of the receiving device, (h) a power mode of the receiving device, or (i) an indication from the receiving device. The transmitting device may output an LDPC coded transmission to the second device based on the selected base graph. As a corollary, a base graph for an LDPC decoder may be selected by a receiving wireless device based upon one or more configuration parameters of the receiving wireless device. For example, a receiving device may select a base graph from a plurality of base graphs based on information associated with the receiving device. The information associated with the receiving device may include at least one of (a) a decoding complexity of the receiving device, (b) a device category of the receiving device, (c) a capability of the receiving device, (d) a decoder mode of the receiving device, (e) a receiver complexity of the receiving device, (f) a receiver mode of the receiving device, (g) a power consumption of the receiving device, (h) a power mode of the receiving device, (i) an indication from the receiving device, (j) a first bandwidth of a CC, or (k) a second bandwidth of a transmission. The receiving device may be further configured to receive an LDPC coded transmission from a transmitting device based on the selected base graph.

The detailed description set forth below in connection with the drawings describes various configurations and does not represent the only configurations in which the concepts described herein may be practiced. The detailed description includes specific details for the purpose of providing a thorough understanding of various concepts. However, these concepts may be practiced without these specific details. In some instances, well known structures and components are shown in block diagram form in order to avoid obscuring such concepts.

Several aspects of telecommunication systems are presented with reference to various apparatus and methods. These apparatus and methods are described in the following detailed description and illustrated in the accompanying drawings by various blocks, components, circuits, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented as a "processing system" that includes one or more processors. Examples of processors include microprocessors, microcontrollers, graphics processing units (GPUs), central processing units (CPUs), application processors, digital signal processors (DSPs), reduced instruction set computing (RISC) processors, systems on a chip (SoC), baseband processors, field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software, whether referred to as software, firmware, middleware, microcode, hardware description language, or otherwise, shall be construed broadly to mean instructions, instruction sets, code, code segments, program code, programs, subprograms, software components, applications, software applications, software packages, routines, subroutines, objects, executables, threads of execution, procedures, functions, or any combination thereof.

Accordingly, in one or more example aspects, implementations, and/or use cases, the functions described may be implemented in hardware, software, or any combination thereof. If implemented in software, the functions may be stored on or encoded as one or more instructions or code on a computer-readable medium. Computer-readable media includes computer storage media. Storage media may be any available media that can be accessed by a computer. By way of example, such computer-readable media can include a random-access memory (RAM), a read-only memory (ROM), an electrically erasable programmable ROM (EEPROM), optical disk storage, magnetic disk storage, other magnetic storage devices, combinations of the types of computer-readable media, or any other medium that can be used to store computer executable code in the form of instructions or data structures that can be accessed by a computer.

While aspects, implementations, and/or use cases are described in this application by illustration to some examples, additional or different aspects, implementations and/or use cases may come about in many different arrangements and scenarios. Aspects, implementations, and/or use cases described herein may be implemented across many differing platform types, devices, systems, shapes, sizes, and packaging arrangements. For example, aspects, implementations, and/or use cases may come about via integrated chip implementations and other non-module-component based devices (e.g., end-user devices, vehicles, communication devices, computing devices, industrial equipment, retail/purchasing devices, medical devices, artificial intelligence (AI)-enabled devices, etc.). While some examples may or may not be specifically directed to use cases or applications, a wide assortment of applicability of described examples may occur. Aspects, implementations, and/or use cases may range a spectrum from chip-level or modular components to non-modular, non-chip-level implementations and further to aggregate, distributed, or original equipment manufacturer (OEM) devices or systems incorporating one or more techniques herein. In some practical settings, devices incorporating described aspects and features may also include additional components and features for implementation and practice of claimed and described aspect. For example, transmission and reception of wireless signals necessarily includes a number of components for analog and digital purposes (e.g., hardware components including antenna, RF-chains, power amplifiers, modulators, buffer, processor(s), interleaver, adders/summers, etc.). Techniques described herein may be practiced in a wide variety of devices, chip-level components, systems, distributed arrangements, aggregated or disaggregated components, end-user devices, etc. of varying sizes, shapes, and constitution.

Deployment of communication systems, such as 5G NR systems, may be arranged in multiple manners with various components or constituent parts. In a 5G NR system, or network, a network node, a network entity, a mobility element of a network, a radio access network (RAN) node, a core network node, a network element, or a network equipment, such as a base station (BS), or one or more units (or one or more components) performing base station functionality, may be implemented in an aggregated or disaggregated architecture. For example, a BS (such as a Node B (NB), evolved NB (eNB), NR BS, 5G NB, access point (AP), a transmit receive point (TRP), or a cell, etc.) may be implemented as an aggregated base station (also known as a standalone BS or a monolithic BS) or a disaggregated base station.

An aggregated base station may be configured to utilize a radio protocol stack that is physically or logically integrated within a single RAN node. A disaggregated base station may be configured to utilize a protocol stack that is physically or logically distributed among two or more units (such as one or more central or centralized units (CUs), one or more distributed units (DUs), or one or more radio units (RUs)). In some aspects, a CU may be implemented within a RAN node, and one or more DUs may be co-located with the CU, or alternatively, may be geographically or virtually distributed throughout one or multiple other RAN nodes. The DUs may be implemented to communicate with one or more RUs. Each of the CU, DU and RU can be implemented as virtual units, i.e., a virtual central unit (VCU), a virtual distributed unit (VDU), or a virtual radio unit (VRU).

Base station operation or network design may consider aggregation characteristics of base station functionality. For example, disaggregated base stations may be utilized in an integrated access backhaul (IAB) network, an open radio access network (O-RAN (such as the network configuration sponsored by the O-RAN Alliance)), or a virtualized radio access network (vRAN, also known as a cloud radio access network (C-RAN)). Disaggregation may include distributing functionality across two or more units at various physical locations, as well as distributing functionality for at least one unit virtually, which can enable flexibility in network design. The various units of the disaggregated base station, or disaggregated RAN architecture, can be configured for wired or wireless communication with at least one other unit.

FIG. 1 is a diagram 100 illustrating an example of a wireless communications system and an access network. The illustrated wireless communications system includes a disaggregated base station architecture. The disaggregated base station architecture may include one or more CUs 110 that can communicate directly with a core network 120 via a backhaul link, or indirectly with the core network 120 through one or more disaggregated base station units (such as a Near-Real Time (Near-RT) RAN Intelligent Controller (RIC) 125 via an E2 link, or a Non-Real Time (Non-RT) RIC 115 associated with a Service Management and Orchestration (SMO) Framework 105, or both). A CU 110 may communicate with one or more DUs 130 via respective midhaul links, such as an F1 interface. The DUs 130 may communicate with one or more RUs 140 via respective fronthaul links. The RUs 140 may communicate with respective UEs 104 via one or more radio frequency (RF) access links. In some implementations, the UE 104 may be simultaneously served by multiple RUs 140.

Each of the units, i.e., the CUs 110, the DUs 130, the RUs 140, as well as the Near-RT RICs 125, the Non-RT RICs 115, and the SMO Framework 105, may include one or more interfaces or be coupled to one or more interfaces configured to receive or to transmit signals, data, or information (collectively, signals) via a wired or wireless transmission medium. Each of the units, or an associated processor or controller providing instructions to the communication interfaces of the units, can be configured to communicate with one or more of the other units via the transmission medium. For example, the units can include a wired interface configured to receive or to transmit signals over a wired transmission medium to one or more of the other units. Additionally, the units can include a wireless interface, which may include a receiver, a transmitter, or a transceiver (such as an RF transceiver), configured to receive or to transmit signals, or both, over a wireless transmission medium to one or more of the other units.

In some aspects, the CU 110 may host one or more higher layer control functions. Such control functions can include radio resource control (RRC), packet data convergence protocol (PDCP), service data adaptation protocol (SDAP), or the like. Each control function can be implemented with an interface configured to communicate signals with other control functions hosted by the CU 110. The CU 110 may be configured to handle user plane functionality (i.e., Central Unit—User Plane (CU-UP)), control plane functionality (i.e., Central Unit—Control Plane (CU-CP)), or a combination thereof. In some implementations, the CU 110 can be logically split into one or more CU-UP units and one or more CU-CP units. The CU-UP unit can communicate bidirectionally with the CU-CP unit via an interface, such as an E1 interface when implemented in an O-RAN configuration. The CU 110 can be implemented to communicate with the DU 130, as necessary, for network control and signaling.

The DU 130 may correspond to a logical unit that includes one or more base station functions to control the operation of one or more RUs 140. In some aspects, the DU 130 may host one or more of a radio link control (RLC) layer, a medium access control (MAC) layer, and one or more high physical (PHY) layers (such as modules for forward error correction (FEC) encoding and decoding, scrambling, modulation, demodulation, or the like) depending, at least in part, on a functional split, such as those defined by 3GPP. In some aspects, the DU 130 may further host one or more low PHY layers. Each layer (or module) can be implemented with an interface configured to communicate signals with other layers (and modules) hosted by the DU 130, or with the control functions hosted by the CU 110.

Lower-layer functionality can be implemented by one or more RUs 140. In some deployments, an RU 140, controlled by a DU 130, may correspond to a logical node that hosts RF processing functions, or low-PHY layer functions (such as performing fast Fourier transform (FFT), inverse FFT (iFFT), digital beamforming, physical random access channel (PRACH) extraction and filtering, or the like), or both, based at least in part on the functional split, such as a lower layer functional split. In such an architecture, the RU(s) 140 can be implemented to handle over the air (OTA) communication with one or more UEs 104. In some implementations, real-time and non-real-time aspects of control and user plane communication with the RU(s) 140 can be controlled by the corresponding DU 130. In some scenarios, this configuration can enable the DU(s) 130 and the CU 110 to be implemented in a cloud-based RAN architecture, such as a vRAN architecture.

The SMO Framework 105 may be configured to support RAN deployment and provisioning of non-virtualized and virtualized network elements. For non-virtualized network elements, the SMO Framework 105 may be configured to support the deployment of dedicated physical resources for RAN coverage requirements that may be managed via an operations and maintenance interface (such as an O1 interface). For virtualized network elements, the SMO Framework 105 may be configured to interact with a cloud computing platform (such as an open cloud (O-Cloud) 190) to perform network element life cycle management (such as to instantiate virtualized network elements) via a cloud computing platform interface (such as an O2 interface). Such virtualized network elements can include, but are not limited to, CUs 110, DUs 130, RUs 140 and Near-RT RICs 125. In some implementations, the SMO Framework 105 can communicate with a hardware aspect of a 4G RAN, such as an open eNB (O-eNB) 111, via an O1 interface. Additionally, in some implementations, the SMO Framework 105 can communicate directly with one or more RUs 140 via an O1 interface. The SMO Framework 105 also may include a Non-RT RIC 115 configured to support functionality of the SMO Framework 105.

The Non-RT RIC 115 may be configured to include a logical function that enables non-real-time control and optimization of RAN elements and resources, artificial intelligence (AI)/machine learning (ML) (AI/ML) workflows including model training and updates, or policy-based guidance of applications/features in the Near-RT RIC 125. The Non-RT RIC 115 may be coupled to or communicate with (such as via an A1 interface) the Near-RT RIC 125. The Near-RT RIC 125 may be configured to include a logical function that enables near-real-time control and optimization of RAN elements and resources via data collection and actions over an interface (such as via an E2 interface) connecting one or more CUs 110, one or more DUs 130, or both, as well as an O-eNB, with the Near-RT RIC 125.

In some implementations, to generate AI/ML models to be deployed in the Near-RT RIC 125, the Non-RT RIC 115 may receive parameters or external enrichment information from external servers. Such information may be utilized by the Near-RT RIC 125 and may be received at the SMO Framework 105 or the Non-RT RIC 115 from non-network data sources or from network functions. In some examples, the Non-RT RIC 115 or the Near-RT RIC 125 may be configured to tune RAN behavior or performance. For example, the Non-RT RIC 115 may monitor long-term trends and patterns for performance and employ AI/ML models to perform corrective actions through the SMO Framework 105 (such as reconfiguration via O1) or via creation of RAN management policies (such as A1 policies).

At least one of the CU 110, the DU 130, and the RU 140 may be referred to as a base station 102. Accordingly, a base station 102 may include one or more of the CU 110, the DU 130, and the RU 140 (each component indicated with dotted lines to signify that each component may or may not be included in the base station 102). The base station 102 provides an access point to the core network 120 for a UE 104. The base stations 102 may include macrocells (high power cellular base station) and/or small cells (low power cellular base station). The small cells include femtocells, picocells, and microcells. A network that includes both small cell and macrocells may be known as a heterogeneous network. A heterogeneous network may also include Home Evolved Node Bs (eNBs) (HeNBs), which may provide service to a restricted group known as a closed subscriber group (CSG). The communication links between the RUs 140 and the UEs 104 may include uplink (UL) (also referred to as reverse link) transmissions from a UE 104 to an RU 140 and/or downlink (DL) (also referred to as forward link) transmissions from an RU 140 to a UE 104. The communication links may use multiple-input and multiple-output (MIMO) antenna technology, including spatial multiplexing, beamforming, and/or transmit diversity. The communication links may be through one or more carriers. The base stations 102/UEs 104 may use spectrum up to Y MHz (e.g., 5, 10, 15, 20, 100, 400, etc. MHz) bandwidth per carrier allocated in a carrier aggregation of up to a total of Yx MHz (x component carriers) used for transmission in each direction. The carriers may or may not be adjacent to each other. Allocation of carriers may be asymmetric with respect to DL and UL (e.g., more or fewer carriers may be allocated for DL than for UL). The component carriers may include a primary component carrier and one or more secondary component carriers. A primary component carrier may be referred to as a primary cell (PCell) and a secondary component carrier may be referred to as a secondary cell (SCell).

Certain UEs 104 may communicate with each other using device-to-device (D2D) communication link 158. The D2D communication link 158 may use the DL/UL wireless wide area network (WWAN) spectrum. The D2D communication link 158 may use one or more sidelink channels, such as a physical sidelink broadcast channel (PSBCH), a physical sidelink discovery channel (PSDCH), a physical sidelink shared channel (PSSCH), and a physical sidelink control channel (PSCCH). D2D communication may be through a variety of wireless D2D communications systems, such as for example, Bluetooth, Wi-Fi based on the Institute of Electrical and Electronics Engineers (IEEE) 802.11 standard, LTE, or NR.

The wireless communications system may further include a Wi-Fi AP 150 in communication with UEs 104 (also referred to as Wi-Fi stations (STAs)) via communication link 154, e.g., in a 5 GHz unlicensed frequency spectrum or the like. When communicating in an unlicensed frequency spectrum, the UEs 104/AP 150 may perform a clear channel assessment (CCA) prior to communicating in order to determine whether the channel is available.

The electromagnetic spectrum is often subdivided, based on frequency/wavelength, into various classes, bands, channels, etc. In 5G NR, two initial operating bands have been identified as frequency range designations FR1 (410 MHz-7.125 GHz) and FR2 (24.25 GHz-52.6 GHz). Although a portion of FR1 is greater than 6 GHz, FR1 is often referred to (interchangeably) as a "sub-6 GHz" band in various documents and articles. A similar nomenclature issue sometimes occurs with regard to FR2, which is often referred to (interchangeably) as a "millimeter wave" band in documents and articles, despite being different from the extremely high frequency (EHF) band (30 GHz-300 GHz) which is identified by the International Telecommunications Union (ITU) as a "millimeter wave" band.

The frequencies between FR1 and FR2 are often referred to as mid-band frequencies. Recent 5G NR studies have identified an operating band for these mid-band frequencies as frequency range designation FR3 (7.125 GHz-24.25 GHz). Frequency bands falling within FR3 may inherit FR1 characteristics and/or FR2 characteristics, and thus may effectively extend features of FR1 and/or FR2 into mid-band frequencies. In addition, higher frequency bands are currently being explored to extend 5G NR operation beyond 52.6 GHz. For example, three higher operating bands have been identified as frequency range designations FR2-2 (52.6 GHz-71 GHz), FR4 (71 GHz-114.25 GHz), and FR5 (114.25 GHz-300 GHz). Each of these higher frequency bands falls within the EHF band.

With the above aspects in mind, unless specifically stated otherwise, the term "sub-6 GHz" or the like if used herein may broadly represent frequencies that may be less than 6 GHz, may be within FR1, or may include mid-band frequencies. Further, unless specifically stated otherwise, the term "millimeter wave" or the like if used herein may broadly represent frequencies that may include mid-band frequencies, may be within FR2, FR4, FR2-2, and/or FR5, or may be within the EHF band.

The base station 102 and the UE 104 may each include a plurality of antennas, such as antenna elements, antenna panels, and/or antenna arrays to facilitate beamforming. The base station 102 may transmit a beamformed signal 182 to the UE 104 in one or more transmit directions. The UE 104 may receive the beamformed signal from the base station 102 in one or more receive directions. The UE 104 may also transmit a beamformed signal 184 to the base station 102 in one or more transmit directions. The base station 102 may receive the beamformed signal from the UE 104 in one or more receive directions. The base station 102/UE 104 may perform beam training to determine the best receive and transmit directions for each of the base station 102/UE 104. The transmit and receive directions for the base station 102 may or may not be the same. The transmit and receive directions for the UE 104 may or may not be the same.

The base station 102 may include and/or be referred to as a gNB, Node B, eNB, an access point, a base transceiver station, a radio base station, a radio transceiver, a transceiver function, a basic service set (BSS), an extended service set (ESS), a transmit reception point (TRP), network node, network entity, network equipment, or some other suitable terminology. The base station 102 can be implemented as an integrated access and backhaul (IAB) node, a relay node, a sidelink node, an aggregated (monolithic) base station with a baseband unit (BBU) (including a CU and a DU) and an RU, or as a disaggregated base station including one or more of a CU, a DU, and/or an RU. The set of base stations, which may include disaggregated base stations and/or aggregated base stations, may be referred to as next generation (NG) RAN (NG-RAN).

The core network 120 may include an Access and Mobility Management Function (AMF) 161, a Session Management Function (SMF) 162, a User Plane Function (UPF) 163, a Unified Data Management (UDM) 164, one or more location servers 168, and other functional entities. The AMF 161 is the control node that processes the signaling between the UEs 104 and the core network 120. The AMF 161 supports registration management, connection management, mobility management, and other functions. The SMF 162 supports session management and other functions. The UPF 163 supports packet routing, packet forwarding, and other functions. The UDM 164 supports the generation of authentication and key agreement (AKA) credentials, user identification handling, access authorization, and subscription management. The one or more location servers 168 are illustrated as including a Gateway Mobile Location Center (GMLC) 165 and a Location Management Function (LMF) 166. However, generally, the one or more location servers 168 may include one or more location/positioning servers, which may include one or more of the GMLC 165, the LMF 166, a position determination entity (PDE), a serving mobile location center (SMLC), a mobile positioning center (MPC), or the like. The GMLC 165 and the LMF 166 support UE location services. The GMLC 165 provides an interface for clients/applications (e.g., emergency services) for accessing UE positioning information. The LMF 166 receives measurements and assistance information from the NG-RAN and the UE 104 via the AMF 161 to compute the position of the UE 104. The NG-RAN may utilize one or more positioning methods in order to determine the position of the UE 104. Positioning the UE 104 may involve signal measurements, a position estimate, and an optional velocity computation based on the measurements. The signal measurements may be made by the UE 104 and/or the serving base station 102. The signals measured may be based on one or more of a satellite positioning system (SPS) 170 (e.g., one or more of a Global Navigation Satellite System (GNSS), global position system (GPS), non-terrestrial network (NTN), or other satellite position/location system), LTE signals, wireless local area network (WLAN) signals, Bluetooth signals, a terrestrial beacon system (TBS), sensor-based information (e.g., barometric pressure sensor, motion sensor), NR enhanced cell ID (NR E-CID) methods, NR signals (e.g., multi-round trip time (Multi-RTT), DL angle-of-departure (DL-AoD), DL time difference of arrival (DL-TDOA), UL time difference of arrival (UL-TDOA), and UL angle-of-arrival (UL-AoA) positioning), and/or other systems/signals/sensors.

Examples of UEs 104 include a cellular phone, a smart phone, a session initiation protocol (SIP) phone, a laptop, a personal digital assistant (PDA), a satellite radio, a global positioning system, a multimedia device, a video device, a digital audio player (e.g., MP3 player), a camera, a game console, a tablet, a smart device, a wearable device, a vehicle, an electric meter, a gas pump, a large or small kitchen appliance, a healthcare device, an implant, a sensor/actuator, a display, or any other similar functioning device. Some of the UEs 104 may be referred to as IoT devices (e.g., parking meter, gas pump, toaster, vehicles, heart monitor, etc.). The UE 104 may also be referred to as a station, a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology. In some scenarios, the term UE may also apply to one or more companion devices such as in a device constellation arrangement. One or more of these devices may collectively access the network and/or individually access the network.

Referring again to FIG. 1, in certain aspects, the UE 104 may be configured to use LDPC transmission component 198 to select a base graph from a plurality of base graphs based on one or more of (a) a decoding complexity of a second device, (b) a device category of the second device, (c) a capability of the second device, (d) a decoder mode of the second device, (e) a receiver complexity of the second device, (f) a receiver mode of the second device, (g) a power consumption of the second device, (h) a power mode of the second device, or (i) an indication from the second device. The LDPC transmission component 198 may also be configured to output a low-density parity check (LDPC) coded transmission to the second device based on the selected base graph. In certain aspects, the UE 104 may be configured to use LDPC reception component 199 to select a base graph from a plurality of base graphs based on one or more of (a) a decoding complexity of a second device, (b) a device category of the second device, (c) a capability of the second device, (d) a decoder mode of the second device, (e) a receiver complexity of the second device, (f) a receiver mode of the second device, (g) a power consumption of the second device, (h) a power mode of the second device, (i) an indication from the second device, (j) a first bandwidth of a component carrier (CC), or (k) a second bandwidth of a transmission. The LDPC reception component 199 may also be configured to receive an LDPC coded transmission from a first device based on the selected base graph.

In certain aspects, the base station 102 may be configured to use LDPC transmission component 198 to select a base graph from a plurality of base graphs based on one or more of (a) a decoding complexity of a second device, (b) a device category of the second device, (c) a capability of the second device, (d) a decoder mode of the second device, (e) a receiver complexity of the second device, (f) a receiver mode of the second device, (g) a power consumption of the second device, (h) a power mode of the second device, or (i) an indication from the second device. The LDPC transmission component 198 may also be configured to output an LDPC coded transmission to the second device based on the selected base graph. In certain aspects, the base station 102 may be configured to use LDPC reception component 199 to select a base graph from a plurality of base graphs based on one or more of (a) a decoding complexity of a second device, (b) a device category of the second device, (c) a capability of the second device, (d) a decoder mode of the second device, (e) a receiver complexity of the second device, (f) a receiver mode of the second device, (g) a power consumption of the second device, (h) a power mode of the second device, (i) an indication from the second device, (j) a first bandwidth of a component carrier (CC), or (k) a second bandwidth of a transmission. The LDPC reception component 199 may also be configured to receive an LDPC coded transmission from a first device based on the selected base graph. Although the following description may be focused on 5G NR, the concepts described herein may be applicable to other similar areas, such as LTE, LTE-A, CDMA, GSM, and other wireless technologies. Although the following description may be focused on LDPC code design for high-throughput use cases, the LDPC code design may also be used to save power at a wireless device, such as a UE, by opportunistically selecting a low complexity decoder. For example, even when the throughput is not very high, if a wireless device wishes to change to a power saving mode, similar aspects may apply to opportunistically select a low complexity decoder.

FIG. 2A is a diagram 200 illustrating an example of a first subframe within a 5G NR frame structure. FIG. 2B is a diagram 230 illustrating an example of DL channels within a 5G NR subframe. FIG. 2C is a diagram 250 illustrating an example of a second subframe within a 5G NR frame structure. FIG. 2D is a diagram 280 illustrating an example of UL channels within a 5G NR subframe. The 5G NR frame structure may be frequency division duplexed (FDD) in which for a particular set of subcarriers (carrier system bandwidth), subframes within the set of subcarriers are dedicated for either DL or UL, or may be time division duplexed (TDD) in which for a particular set of subcarriers (carrier system bandwidth), subframes within the set of subcarriers are dedicated for both DL and UL. In the examples provided by FIGS. 2A, 2C, the 5G NR frame structure is assumed to be TDD, with subframe 4 being configured with slot format 28 (with mostly DL), where D is DL, U is UL, and F is flexible for use between DL/UL, and subframe 3 being configured with slot format 1 (with all UL). While subframes 3, 4 are shown with slot formats 1, 28, respectively, any particular subframe may be configured with any of the various available slot formats 0-61. Slot formats 0, 1 are all DL, UL, respectively. Other slot formats 2-61 include a mix of DL, UL, and flexible symbols. UEs are configured with the slot format (dynamically through DL control information (DCI), or semi-statically/statically through radio resource control (RRC) signaling) through a received slot format indicator (SFI). Note that the description infra applies also to a 5G NR frame structure that is TDD.

FIGS. 2A-2D illustrate a frame structure, and the aspects of the present disclosure may be applicable to other wireless communication technologies, which may have a different frame structure and/or different channels. A frame (10 ms) may be divided into 10 equally sized subframes (1 ms). Each subframe may include one or more time slots. Subframes may also include mini-slots, which may include 7, 4, or 2 symbols. Each slot may include 14 or 12 symbols, depending on whether the cyclic prefix (CP) is normal or extended. For normal CP, each slot may include 14 symbols, and for extended CP, each slot may include 12 symbols. The symbols on DL may be CP orthogonal frequency division multiplexing (OFDM) (CP-OFDM) symbols. The symbols on UL may be CP-OFDM symbols (for high throughput scenarios) or discrete Fourier transform (DFT) spread OFDM (DFT-s-OFDM) symbols (also referred to as single carrier frequency-division multiple access (SC-FDMA) symbols) (for power limited scenarios; limited to a single stream transmission). The number of slots within a subframe is based on the CP and the numerology. The numerology defines the subcarrier spacing (SCS) and, effectively, the symbol length/duration, which is equal to 1/SCS.

| μ | SCS<br>$\Delta f = 2^\mu \cdot 15 [kHz]$ | Cyclic prefix |
|---|---|---|
| 0 | 15 | Normal |
| 1 | 30 | Normal |
| 2 | 60 | Normal, Extended |
| 3 | 120 | Normal |
| 4 | 240 | Normal |

For normal CP (14 symbols/slot), different numerologies μ 0 to 4 allow for 1, 2, 4, 8, and 16 slots, respectively, per subframe. For extended CP, the numerology 2 allows for 4 slots per subframe. Accordingly, for normal CP and numerology ii, there are 14 symbols/slot and $2^\mu$ slots/subframe. The subcarrier spacing may be equal to $2^\mu * 15$ kHz, where μ is the numerology 0 to 4. As such, the numerology μ=0 has a subcarrier spacing of 15 kHz and the numerology μ=4 has a subcarrier spacing of 240 kHz. The symbol length/duration is inversely related to the subcarrier spacing. FIGS. 2A-2D provide an example of normal CP with 14 symbols per slot and numerology μ=2 with 4 slots per subframe. The slot duration is 0.25 ms, the subcarrier spacing is 60 kHz, and the symbol duration is approximately 16.67 μs. Within a set of frames, there may be one or more different bandwidth parts (BWPs) (see FIG. 2B) that are frequency division multiplexed. Each BWP may have a particular numerology and CP (normal or extended).

A resource grid may be used to represent the frame structure. Each time slot includes a resource block (RB) (also referred to as physical RBs (PRBs)) that extends 12 consecutive subcarriers. The resource grid is divided into multiple resource elements (REs). The number of bits carried by each RE depends on the modulation scheme.

As illustrated in FIG. 2A, some of the REs carry reference (pilot) signals (RS) for the UE. The RS may include demodulation RS (DM-RS) (indicated as R for one particular configuration, but other DM-RS configurations are possible) and channel state information reference signals (CSI-RS) for channel estimation at the UE. The RS may also include beam measurement RS (BRS), beam refinement RS (BRRS), and phase tracking RS (PT-RS).

FIG. 2B illustrates an example of various DL channels within a subframe of a frame. The physical downlink control channel (PDCCH) carries DCI within one or more control channel elements (CCEs) (e.g., 1, 2, 4, 8, or 16 CCEs), each CCE including six RE groups (REGs), each REG including 12 consecutive REs in an OFDM symbol of an RB. A PDCCH within one BWP may be referred to as a control resource set (CORESET). A UE is configured to monitor PDCCH candidates in a PDCCH search space (e.g., common search space, UE-specific search space) during PDCCH monitoring occasions on the CORESET, where the PDCCH candidates have different DCI formats and different aggregation levels. Additional BWPs may be located at greater and/or lower frequencies across the channel bandwidth. A primary synchronization signal (PSS) may be within symbol 2 of particular subframes of a frame. The PSS is used by a UE 104 to determine subframe/symbol timing and a physical layer identity. A secondary synchronization signal (SSS) may be within symbol 4 of particular subframes of a frame. The SSS is used by a UE to determine a physical layer cell identity group number and radio frame timing. Based on the physical layer identity and the physical layer cell identity group number, the UE can determine a physical cell identifier (PCI). Based on the PCI, the UE can determine the locations of the DM-RS. The physical broadcast channel (PBCH), which carries a master information block (MIB), may be logically grouped with the PSS and SSS to form a synchronization signal (SS)/PBCH block (also referred to as SS block (SSB)). The MIB provides a number of RBs in the system bandwidth and a system frame number (SFN). The physical downlink shared channel (PDSCH) carries user data, broadcast system information not transmitted through the PBCH such as system information blocks (SIB s), and paging messages.

As illustrated in FIG. 2C, some of the REs carry DM-RS (indicated as R for one particular configuration, but other DM-RS configurations are possible) for channel estimation at the base station. The UE may transmit DM-RS for the physical uplink control channel (PUCCH) and DM-RS for the physical uplink shared channel (PUSCH). The PUSCH DM-RS may be transmitted in the first one or two symbols of the PUSCH. The PUCCH DM-RS may be transmitted in different configurations depending on whether short or long PUCCHs are transmitted and depending on the particular PUCCH format used. The UE may transmit sounding reference signals (SRS). The SRS may be transmitted in the last symbol of a subframe. The SRS may have a comb structure, and a UE may transmit SRS on one of the combs. The SRS may be used by a base station for channel quality estimation to enable frequency-dependent scheduling on the UL.

FIG. 2D illustrates an example of various UL channels within a subframe of a frame. The PUCCH may be located as indicated in one configuration. The PUCCH carries uplink control information (UCI), such as scheduling requests, a channel quality indicator (CQI), a precoding matrix indicator (PMI), a rank indicator (RI), and hybrid automatic repeat request (HARQ) acknowledgment (ACK) (HARQ-ACK) feedback (i.e., one or more HARQ ACK bits indicating one or more ACK and/or negative ACK (NACK)). The PUSCH carries data, and may additionally be used to carry a buffer status report (BSR), a power headroom report (PHR), and/or UCI.

Figure 3:
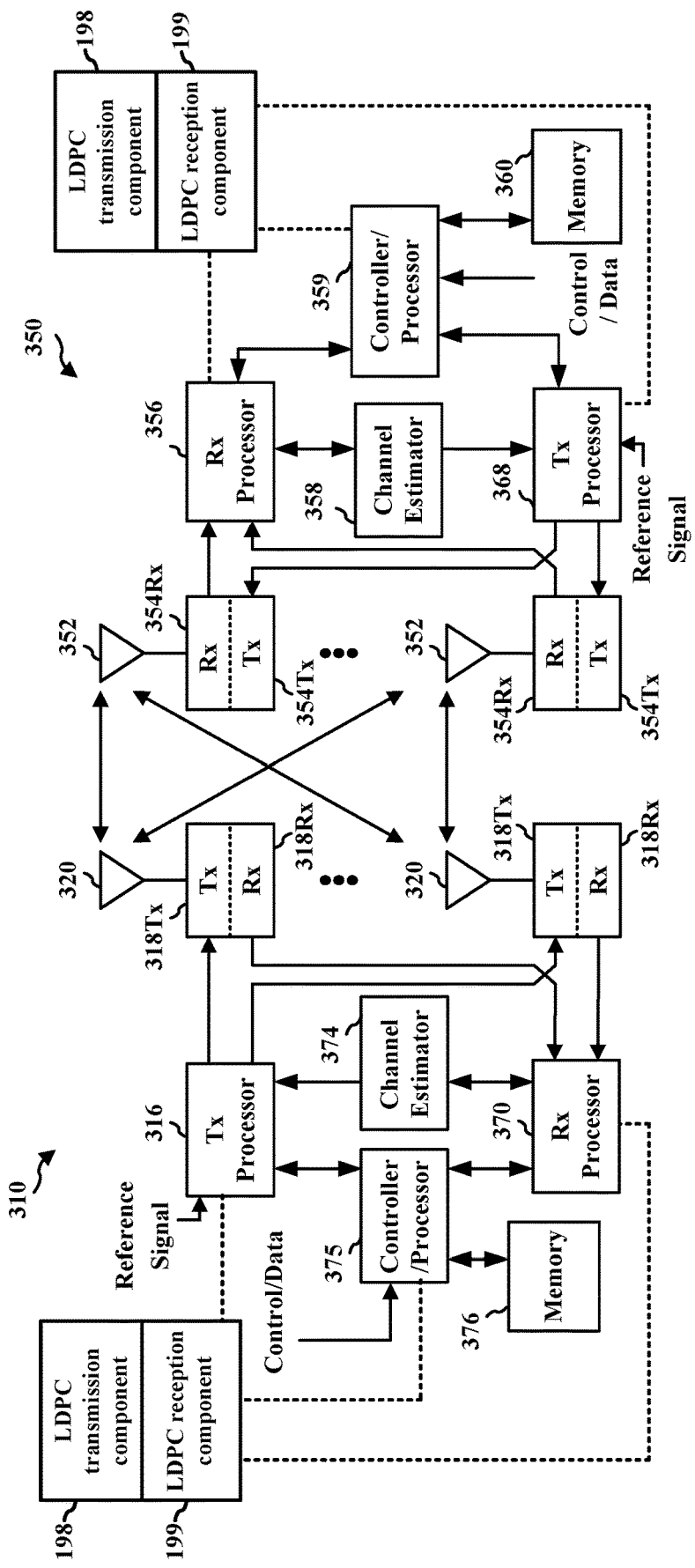
FIG. 3 is a diagram illustrating an example of a base station and user equipment (UE) in an access network.

FIG. 3 is a block diagram of a base station 310 in communication with a UE 350 in an access network. In the DL, Internet protocol (IP) packets may be provided to a controller/processor 375. The controller/processor 375 implements layer 3 and layer 2 functionality. Layer 3 includes a radio resource control (RRC) layer, and layer 2 includes a service data adaptation protocol (SDAP) layer, a packet data convergence protocol (PDCP) layer, a radio link control (RLC) layer, and a medium access control (MAC) layer. The controller/processor 375 provides RRC layer functionality associated with broadcasting of system information (e.g., MIB, SIB s), RRC connection control (e.g., RRC connection paging, RRC connection establishment, RRC connection modification, and RRC connection release), inter radio access technology (RAT) mobility, and measurement configuration for UE measurement reporting; PDCP layer functionality associated with header compression/decompression, security (ciphering, deciphering, integrity protection, integrity verification), and handover support functions; RLC layer functionality associated with the transfer of upper layer packet data units (PDUs), error correction through ARQ, concatenation, segmentation, and reassembly of RLC service data units (SDUs), re-segmentation of RLC data PDUs, and reordering of RLC data PDUs; and MAC layer functionality associated with mapping between logical channels and transport channels, multiplexing of MAC SDUs onto transport blocks (TBs), demultiplexing of MAC SDUs from TBs, scheduling information reporting, error correction through HARQ, priority handling, and logical channel prioritization.

The transmit (Tx) processor 316 and the receive (Rx) processor 370 implement layer 1 functionality associated with various signal processing functions. Layer 1, which includes a physical (PHY) layer, may include error detection on the transport channels, forward error correction (FEC) coding/decoding of the transport channels, interleaving, rate matching, mapping onto physical channels, modulation/demodulation of physical channels, and MIMO antenna processing. The Tx processor 316 handles mapping to signal constellations based on various modulation schemes (e.g., binary phase-shift keying (BPSK), quadrature phase-shift keying (QPSK), M-phase-shift keying (M-PSK), M-quadrature amplitude modulation (M-QAM)). The coded and modulated symbols may then be split into parallel streams. Each stream may then be mapped to an OFDM subcarrier, multiplexed with a reference signal (e.g., pilot) in the time and/or frequency domain, and then combined together using an Inverse Fast Fourier Transform (IFFT) to produce a physical channel carrying a time domain OFDM symbol stream. The OFDM stream is spatially precoded to produce multiple spatial streams. Channel estimates from a channel estimator 374 may be used to determine the coding and modulation scheme, as well as for spatial processing. The channel estimate may be derived from a reference signal and/or channel condition feedback transmitted by the UE 350. Each spatial stream may then be provided to a different antenna 320 via a separate transmitter 318Tx. Each transmitter 318Tx may modulate a radio frequency (RF) carrier with a respective spatial stream for transmission.

At the UE 350, each receiver 354Rx receives a signal through its respective antenna 352. Each receiver 354Rx recovers information modulated onto an RF carrier and provides the information to the receive (Rx) processor 356. The Tx processor 368 and the Rx processor 356 implement layer 1 functionality associated with various signal processing functions. The Rx processor 356 may perform spatial processing on the information to recover any spatial streams destined for the UE 350. If multiple spatial streams are destined for the UE 350, they may be combined by the Rx processor 356 into a single OFDM symbol stream. The Rx processor 356 then converts the OFDM symbol stream from the time-domain to the frequency domain using a Fast Fourier Transform (FFT). The frequency domain signal includes a separate OFDM symbol stream for each subcarrier of the OFDM signal. The symbols on each subcarrier, and the reference signal, are recovered and demodulated by determining the most likely signal constellation points transmitted by the base station 310. These soft decisions may be based on channel estimates computed by the channel estimator 358. The soft decisions are then decoded and deinterleaved to recover the data and control signals that were originally transmitted by the base station 310 on the physical channel. The data and control signals are then provided to the controller/processor 359, which implements layer 3 and layer 2 functionality.

The controller/processor 359 can be associated with a memory 360 that stores program codes and data. The memory 360 may be referred to as a computer-readable medium. In the UL, the controller/processor 359 provides demultiplexing between transport and logical channels, packet reassembly, deciphering, header decompression, and control signal processing to recover IP packets. The controller/processor 359 is also responsible for error detection using an ACK and/or NACK protocol to support HARQ operations.

Similar to the functionality described in connection with the DL transmission by the base station 310, the controller/processor 359 provides RRC layer functionality associated with system information (e.g., MIB, SIB s) acquisition, RRC connections, and measurement reporting; PDCP layer functionality associated with header compression/decompression, and security (ciphering, deciphering, integrity protection, integrity verification); RLC layer functionality associated with the transfer of upper layer PDUs, error correction through ARQ, concatenation, segmentation, and reassembly of RLC SDUs, re-segmentation of RLC data PDUs, and reordering of RLC data PDUs; and MAC layer functionality associated with mapping between logical channels and transport channels, multiplexing of MAC SDUs onto TBs, demultiplexing of MAC SDUs from TBs, scheduling information reporting, error correction through HARQ, priority handling, and logical channel prioritization.

Channel estimates derived by a channel estimator 358 from a reference signal or feedback transmitted by the base station 310 may be used by the Tx processor 368 to select the appropriate coding and modulation schemes, and to facilitate spatial processing. The spatial streams generated by the Tx processor 368 may be provided to different antenna 352 via separate transmitters 354Tx. Each transmitter 354Tx may modulate an RF carrier with a respective spatial stream for transmission.

The UL transmission is processed at the base station 310 in a manner similar to that described in connection with the receiver function at the UE 350. Each receiver 318Rx receives a signal through its respective antenna 320. Each receiver 318Rx recovers information modulated onto an RF carrier and provides the information to a Rx processor 370.

The controller/processor 375 can be associated with a memory 376 that stores program codes and data. The memory 376 may be referred to as a computer-readable medium. In the UL, the controller/processor 375 provides demultiplexing between transport and logical channels, packet reassembly, deciphering, header decompression, control signal processing to recover IP packets. The controller/processor 375 is also responsible for error detection using an ACK and/or NACK protocol to support HARQ operations.

At least one of the Tx processor 368, the Rx processor 356, and the controller/processor 359 may be configured to perform aspects in connection with the LDPC transmission component 198 of FIG. 1. At least one of the Tx processor 368, the Rx processor 356, and the controller/processor 359 may be configured to perform aspects in connection with the LDPC reception component 199 of FIG. 1.

At least one of the Tx processor 316, the Rx processor 370, and the controller/processor 375 may be configured to perform aspects in connection with the LDPC transmission component 198 of FIG. 1. At least one of the Tx processor 316, the Rx processor 370, and the controller/processor 375 may be configured to perform aspects in connection with the LDPC reception component 199 of FIG. 1.

Wireless devices, such as UEs and network entities (e.g., base stations, components of base stations) may be configured to support higher throughput. Improving the throughput for wireless devices may use additional computing capability at a receiver. For example, doubling a throughput may use double the modem area and energy consumption of a receiving device having the same processing node size. It may be advantageous to enable wireless devices that support higher throughput to use transmitter and/or receiver algorithms that have less computation complexity (e.g., per bit), than transmissions that use lower throughput. Altering the configuration of channel decoding may reduce the computation complexity at the receiver. For example, an LDPC code may have a flexible decoding complexity by altering the number of iterations. For example, for a message-passing decoder, complexity may scale linearly with a number of iterations, and throughput may have an inverse linear scaling with a number of iterations. However, performance of LDPC decoding may degrade as the number of iterations is reduced. For example, NR LDPC codes may be optimized for a large number of iterations (e.g., more than 50), and may offer reduced performance when a smaller number of iterations is used.

Figure 4:
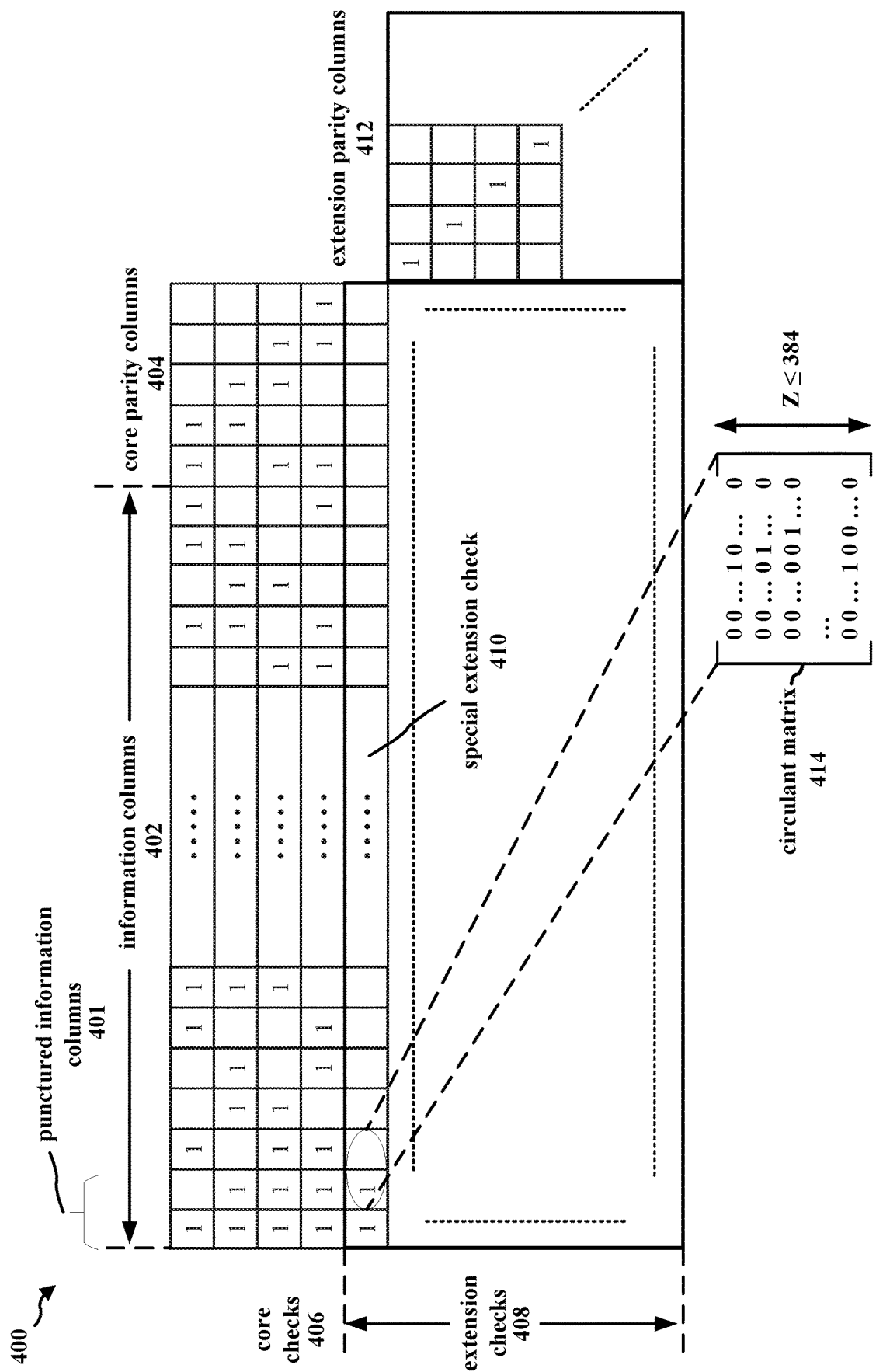
FIG. 4 is a diagram illustrating an example of a parity check matrix (PCM) structure for a low density parity check (LDPC) code.

FIG. 4 shows a parity check matrix (PCM) structure 400 for an LDPC code. Such a code may be quasi-cyclic (QC). An LDPC code may be described by a base graph (BG) and liftings (i.e., a protograph LDPC code). The BG, or protograph, may be a graph that captures the macroscopic properties of the code, such as the threshold of the code over a binary-input additive white Gaussian noise (AWGN) channel. A base graph may be represented by a base matrix whose information columns may denote the variable nodes, and rows may denote the check nodes of the base graph. For example, the PCM structure 400 may represent a base graph having information columns 402, core parity columns 404, and extension parity columns 412. The information columns 402 may include punctured information columns 401 and special extension checks 410. The PCM structure 400 may also have core checks 406 and extension checks 408. Each of the entries of the base PCM structure 400 may be lifted by a circulant identity matrix. In other words, the BG may be copied Z times, and the different copies of the BG may be connected via edge permutation. The identity matrix may have the dimensions of Z×Z, where the circulant may be denoted by an integer in the non-zero entries of the BG matrix. For example, the circulant matrix 414 may be constructed where Z≤384. A total block length may be the size of the BGxZ (e.g., where Z may be referred to as a lift value that lifts the information of the BG to a larger matrix size).

Figure 5:
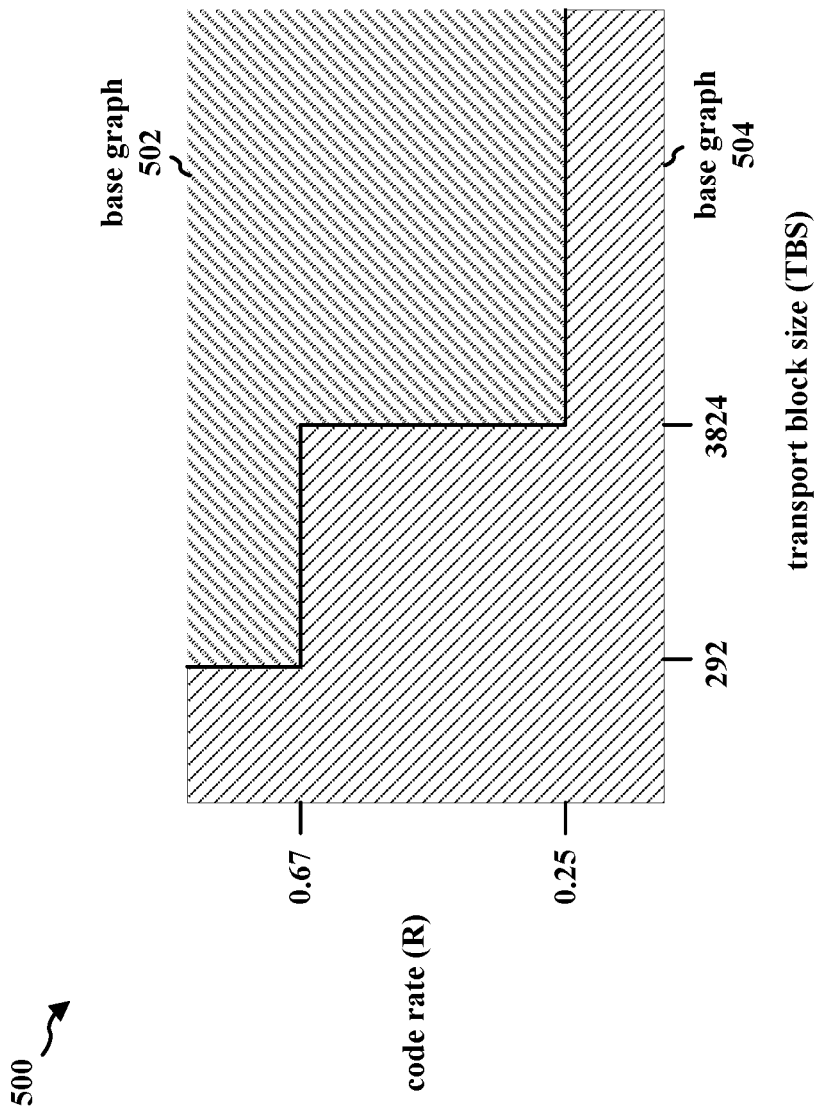
FIG. 5 is a diagram illustrating a code rate graph of different example base graph types.

FIG. 5 shows a code rate graph 500 of an LDPC base graph 502 (i.e., BG1) and an LDPC base graph 504 (i.e., BG2). Each LDPC base graph 502, 504, may have a different performance on different regimes of communication parameters (e.g., block length, coding rate, number of iterations, decoder design). For example, base graph 504 may have a code rate from 0 to 0.95 for a TBS of less than 292, may have a code rate from 0 to 0.67 for a TBS of greater than 292 and less than 3824, and may have a code rate from 0 to 0.25 for a TBS of greater than 3824. The LDPC base graph 502 may have a code rate from 0.67 to 0.95 for a TBS greater than 292 and less than 3824, and may have a code rate from 0.25 o 0.95 for a TBS greater than 3824. Rather than a universal BG that performs best in all regimes, a plurality of base graphs may be provided, and one may be selected over the other based on one or more parameters, for example coding rate and/or payload size (e.g., TBS).

A base graph selection system may use a metric that evaluates the performance of LDPC code generated by different LDPC BGs to select an appropriate LDPC BG. For example, the threshold of the code over a binary-input AWGN channel may be used to select an appropriate LDPC BG. The threshold metric may be defined as the minimum signal to noise ratio (SNR) at which the average block error rate (BER) of any LDPC code of infinite size generated by the BG is below a specific BER threshold (e.g., as an example a BER threshold may be $10^{-6}$) at a given number of iterations (e.g., 15). The threshold may depend upon decoder details and/or information. For example, a floating-point decoder may have a different threshold than a fixed-point decoder. A floating-point decoder may use one or more real numbers as an input and perform arithmetic (e.g., addition, multiplication) on the input to generate a real number output. A fixed-point decoder may use one or more quantized signals of a fixed number of bits as an input, and perform operations, such as arithmetic, on the input within a finite field of a fixed number of bits to generate an output having the fixed number of bits. A flooding scheduling algorithm may have a different threshold than a layered scheduling algorithm. A flooding scheduling algorithm may use a decoding schedule that updates a set of variable nodes and then performs check node updates on the updated set of nodes. The flooding scheduling algorithm may update all variable nodes simultaneously and then may perform check node updates on all of the updated nodes simultaneously. A layered scheduling algorithm may use a decoding schedule that updates one or more variable nodes and/or one or more check nodes in a specified order. Such an order may be based on a layer upon which a node belongs to. For example, nodes in a first layer may be updated before nodes in a second layer in accordance with a layered scheduling algorithm.

A first number of iterations (e.g., flooding iterations or layered iterations) used for a decoder may have a different threshold than a second number of iterations (e.g., flooding iterations or layered iterations) used for a decoder. A first quantity of bits for log likelihood ratio (LLR) quantization at the decoder may have a different threshold than a second quantity of bits for LLR quantization at the decoder. In some aspects, extrinsic information transfer (EXIT) analysis, protograph-EXIT (PEXIT) analysis, and/or density evolution may be used to compute such a threshold. A PEXIT analysis may provide an accurate proxy to predict the performance of actual LDPC code to compute a threshold metric.

The computational complexity of an LDPC decoder may scale linearly with the number of iterations that may be used in the decoding. As a result, one way to reduce the complexity of an LDPC decoder is to reduce the number of iterations used by the decoder. However, this may come at the cost of performance if the number of iterations is reduced by a threshold margin. For example, the performance gap between 25 iterations and 3 iterations of an LDPC decoder may be about 2 dB. Thus, there is a need to reduce the complexity of an LDPC decoder without significantly reducing the cost of performance of the LDPC decoder.

As presented herein, a device may select a base graph for an LDPC decoder based upon one or more configuration parameters of a receiving wireless device. For example, a transmitting device may select a base graph from a plurality of base graphs based on information associated with a receiving device. The information associated with the receiving device may include at least one of (a) a decoding complexity of a receiving device, (b) a device category of the receiving device, (c) a capability of the receiving device, (d) a decoder mode of the receiving device, (e) a receiver complexity of the receiving device, (f) a receiver mode of the receiving device, (g) a power consumption of the receiving device, (h) a power mode of the receiving device, or (i) an indication from the receiving device. The transmitting device may output an LDPC coded transmission to the second device based on the selected base graph. As a corollary, a base graph for an LDPC decoder may be selected by a receiving wireless device based upon one or more configuration parameters of the receiving wireless device. For example, a receiving device may select a base graph from a plurality of base graphs based on information associated with the receiving device. The information associated with the receiving device may include at least one of (a) a decoding complexity of the receiving device, (b) a device category of the receiving device, (c) a capability of the receiving device, (d) a decoder mode of the receiving device, (e) a receiver complexity of the receiving device, (f) a receiver mode of the receiving device, (g) a power consumption of the receiving device, (h) a power mode of the receiving device, (i) an indication from the receiving device, (j) a first bandwidth of a CC, or (k) a second bandwidth of a transmission. The receiving device may be further configured to receive an LDPC coded transmission from a transmitting device based on the selected base graph.

Figure 6:
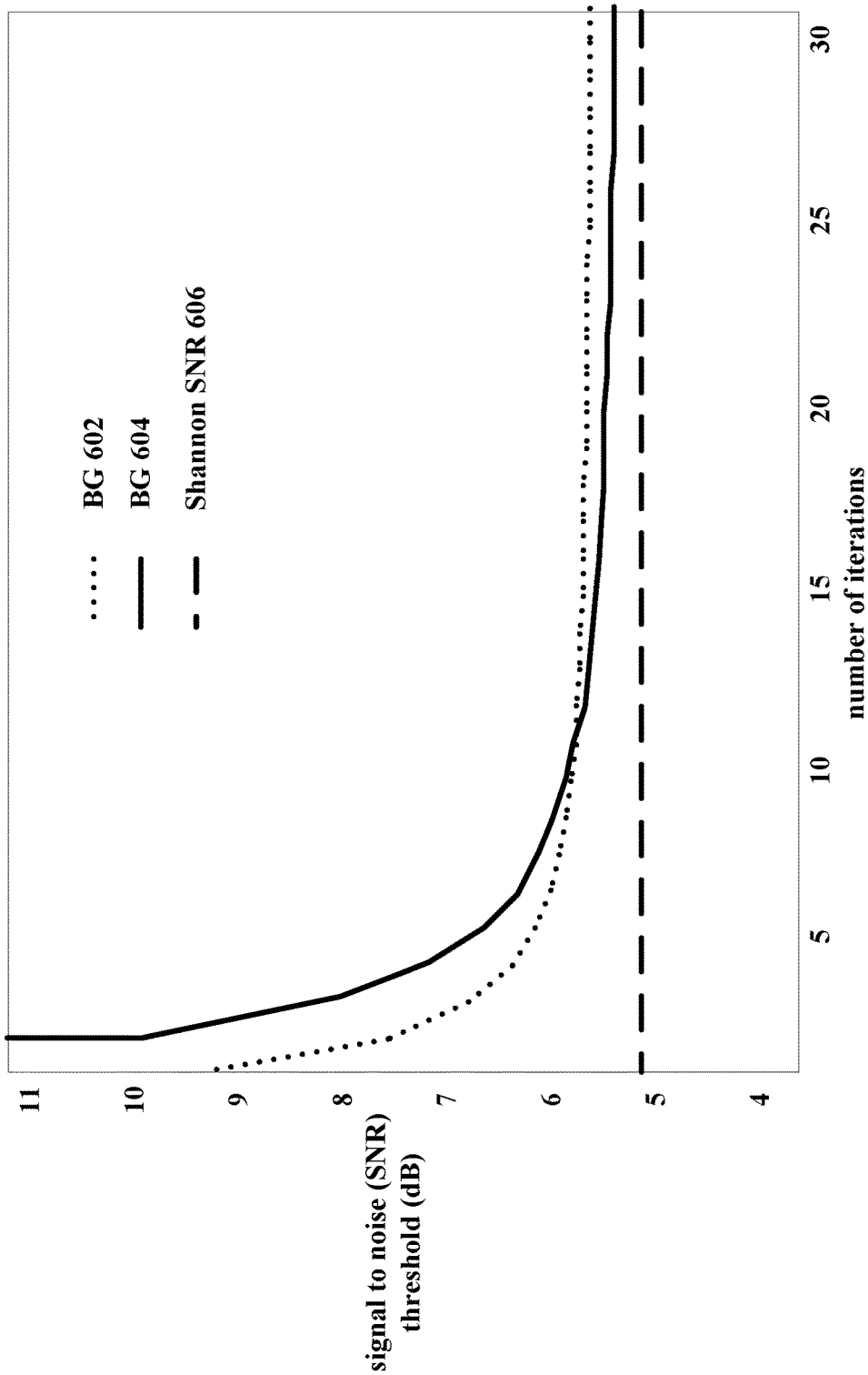
FIG. 6 is a diagram illustrating a performance graph of different example base graph types.

FIG. 6 shows a performance graph 600 illustrating how different base graphs, BG 602 and BG 604, may perform relative to one another as a function of the number of iterations an LDPC decoder based on the base graph uses. Performance graph 600 illustrates the performance of BG 602 and BG 604 relative to a Shannon SNR 606 (e.g., an SNR value at which the Shannon capacity is equal to the rate of the code). BG 602 and BG 604 represent base graphs having a different performance at a first level of complexity and a second level of complexity. For example, BG 604 has a better SNR performance than BG 602 at less than about 10 iterations, while BG 602 has a better SNR performance than BG 604 at greater than about 10 iterations. BG 602 may represent an NR BG (e.g., BG1) having two punctured nodes, a coding rate of 0.88, and a BG size of 5×27. BG 602 may have the same block length and coding rate as BG1. BG 604 may represent a regular LDPC generated by having the same amount of variable degrees and the same amount of check degrees. Other BGs may be utilized that have different performances at different levels of complexity relative to one another, which may result in one BG being preferred at a first level of complexity and a different BG being preferred at a second level of complexity. While two BGs are shown, a system may select from a set of more than two BGs to optimize performance.

BG 602 may outperform BG 604 at a number of iterations greater than about 10. BG 602 may have a better threshold than BG 604 at infinite iterations. BG 602 may be optimized at infinite iterations. BG 604 may outperform BG 602 at a smaller number of iterations less than about 10. For example, at 5 iterations, BG 604 may outperform BG 602 by about 0.5 dB. BG 602 and BG 604 may be used as two of a plurality of base graphs for a wireless device to select from for an LDPC decoding scheme and/or decoding complexity.

Enabling a wireless device to select a BG from BG 602 and BG 604 in FIG. 6, whose SNR performance metrics cross one another as the number of iterations changes, allows the wireless device to optimize an LDPC decoding scheme using BG 604 for a high number of iterations greater than about 10 and using BG 602 for a low number of iterations less than about 10.

A code instance generated using a first BG (e.g., BG 604) may have better performance than a second BG (e.g., BG 602) at a lower number of iterations, and may have worse performance than the second BG at a larger number of iterations. The performance metric may be calculated as a block error rate (BLER) or a bit error rate (BER) at a specific SNR, packet size, and coding rate. A wireless device may select between BG 602 and BG 604 in order to prioritize decoding performance or in order to prioritize decoding complexity. For example, in response to a wireless device being configured to prioritize performance, the wireless device may select BG 602 and use a larger number of iterations. In response to a wireless device being configured to prioritize a low complexity, the wireless device may select BG 604 and to let a receiver use a smaller number of iterations and reduce complexity. In some aspects, where the number of iterations is less than or equal to 10, 11, or 12 with layered decoding, or the number of iterations is less than or equal to 20, 21, 22, or 24 for a flooding iteration, the first BG may have a better performance than the second BG.

The threshold metric for a first BG (e.g., BG 604) may be lower than the threshold metric of a second BG (e.g., BG 602) at a smaller number of iterations. The threshold metric for the first BG may be higher than the threshold metric of second at a larger number of iterations for a given coding rate. The threshold metric may be calculated by measuring the performance using simulations, or via a PEXIT analysis.

The threshold metric of LDPC codes generated by a first BG (e.g., BG 604) may converge to the ultimate threshold metric (i.e., threshold metric at infinite iterations) faster than LDPC codes generated by a second BG (e.g., BG 602).

A code instance generated by a first BG (e.g., BG 604) may have better performance than a code instance generated by a second BG (e.g., BG 602) when decoded with a decoder that has a lower number of quantization bits, but may have worse performance than a code instance generated by the second BG when decoded with a decoder that has a higher number of quantization bits. In other words, the code instance generated by the first BG may have a better performance than the second BG when the LLRs are heavily quantized, but may have a worse performance using a decoder that is lightly quantized. The decoding complexity may be linearly proportional to the number of quantization bits used by the decoder to quantize and process the received signal. In such aspects, a lower number of quantization bits may be used to achieve a lower complexity. The threshold metric for the first BG may be lower than that of the second BG when using a decoder with a lower number of quantization bits, and may have a higher threshold metric than that of the second BG when using a decoder with a higher number of quantization bits.

The minimum coding rate supported by a first BG (e.g., BG 604) may be larger than the minimum coding rate supported by a second BG (e.g., BG 602). For example, the minimum coding rate supported by the second BG may be ⅓ or ⅕, and the minimum coding rate supported by the first BG may be ½. In some embodiments, one BG may have a higher maximum coding rate than the other BG. In some embodiments, one BG may have a higher minimum coding rate than the other BG. Since each BG may support more than one coding rate, a wireless device may compare a range of coding rates for a first BG against a range of coding rates for a second BG to determine which coding rate may have higher maximum or minimum coding rate values with respect to the other BG. Such coding rates may be used to select one BG vs. another BG, for example a wireless device may be configured to select a BG having a higher maximum coding rate or a higher minimum coding rate as compared to the other BGs available to the wireless device.

The code generated from a first BG (e.g., BG 604) may have similar or worse performance than the code generated from a second BG (e.g., BG 602) when using lower order modulation (e.g., quadrature phase shift keying (QPSK), 16 quadrature amplitude modulation (16QAM)). The code generated from the first BG may have a better performance than the code generated from the second BG when using higher order modulation (e.g., a modulation order exceeding a threshold value).

A system may choose one BG over another BG based upon one or more configuration parameters. For example, a system may choose a first BG over a second BG when one or more of the following conditions are satisfied: (a) the coding rate meets or exceeds a threshold value (e.g., ⅔, ¾, or ⅘), (b) the TB size meets or exceeds a threshold size, (c) the number of code blocks (CBs) per TB meets or exceeds a threshold value, (d) the modulation and coding scheme (MCS) meets or exceeds a threshold value, (e) the order of modulation meets or exceeds a threshold value (e.g., 64 quadrature amplitude modulation (64QAM) or above), (f) the number of layers for transmission meets or exceeds a threshold value, (g) the transmission is a DL transmission (e.g., the first BG may be used for DL but not for UL), (h) the transmission is a UL transmission (e.g., the first BG may be used for UL but not for DL), (i) the transmission is a sidelink transmission (e.g., the first BG may be used for sidelink but not for UL or DL), (j) a limited buffer rate matching (LBRM) is enabled (e.g., the first BG may be authorized to be used when LBRM is enabled for a specified TB), (k) a traffic characteristic is detected (e.g., the first BG may be authorized to be used for certain traffic characteristics), (l) a quality of service (QoS) metric meets or exceeds a threshold value, or (m) a priority level of a transmission meets or exceeds a threshold value. A wireless device, such as a UE, may determine a specified TB based on the maximum number of RBs in the CC, the maximum number of MIMO layers configured on the CC, and/or the highest modulation order configured in the CC.

Enabling a wireless device to select a BG, from a plurality of base graphs allows the wireless device to optimize an LDPC encoding/decoding scheme based upon one or more properties of the plurality of base graphs. One BG may be better to use for a first scenario while another BG may be better to use for a second scenario. Moreover, a system may prioritize different performance metrics based upon one or more configuration parameters. For example, with a first set of configuration parameters, a system may prioritize a BG having a higher decoding performance (e.g., lower bit error rate (BER) or block error rate (BLER)) and with a second set of configuration parameters, a system may prioritize a BG having a lower decoder/receiver complexity (e.g., a higher throughput). In some aspects, a performance metric may be calculated as a BLER or a BER at a specific SNR and packet size. Enabling a wireless device to select a BG from a plurality of BGs allows the wireless device to prioritize different performance metrics based upon changing configuration parameters.

A wireless device, such as a UE, may be configured to recommend a selection of a BG, or may be configured to provide a configuration parameter that may be used to recommend a selection of a BG. For example, the performance of an LDPC code instance generated by a BG may depend on the particular decoder that a UE implements and/or uses, however a network entity may not have any information on what decoder the UE plans to use for decoding. Thus, a wireless device may recommend a BG to use to another wireless device.

In one aspect, a wireless device may set a configuration parameter to switch to a lower complexity decoder and/or a low complexity decoding mode. In response, the wireless device may select a BG that has a better decoding performance for the lower complexity decoder and/or the low complexity decoding mode. The wireless device may provide the recommendation in a CSI report. For example, the CSI report may have one or more bits that may be used to select a preferred BG from a plurality of BGs. The wireless device may output the CSI report to another wireless device that may select a BG that has a better decoding performance for the lower complexity decoder and/or the low complexity decoding mode based on the CSI report.

In another aspect, a wireless device may indicate to another wireless device to switch to a low complexity decoder. For example, the first wireless device may indicate that a new decoder has a lower number of iterations or uses fewer bits for LLR quantization. In response, the second wireless device may select a BG based on the decoder used by the first wireless device.

In another aspect, a wireless device may be configured to generate one or more CQI reports. For example, the wireless device may generate a first CQI report for a first BG and a second CQI report for a second BG. The wireless device may generate CQI reports that report absolute CQI values in each report. In another aspect, the wireless device may generate one CQI report that reports one or more absolute CQI values, and another CQI report that indicates the performance delta between the first BG and the second BG. In one aspect, if the wireless device is configured to use a low complexity decoder, the CQI may indicate a better performance for the first BG, and in another aspect, if the wireless device is configured to use a high complexity decoder, the CQI may indicate a worse performance for the first BG. The wireless device may be configured to transmit one or more of the CQI reports to a second wireless device (e.g., a network entity) to allow the second wireless device to make a similar analysis.

In another aspect, a wireless device may be configured to define and/or provide a new capability for the supported maximum data rate. The capability may be, for example, a UE capability for a UE. The capability may be included as a set of one or more wireless device configuration parameters provided to another wireless device, such as a network entity. The supported maximum data rate may indicate, for example, that the wireless device may support a first number of carriers, a second number of RBs in band, and/or a third number of band combinations with a first decoding complexity (e.g., a regular decoding complexity). The supported maximum data rate may indicate, for example, that the wireless device may support a fourth number of carriers, a fifth number of RBs in band, and/or a sixth number of band combinations with a second decoding complexity (e.g., a reduced-complexity decoding scheme). Where the second decoding complexity is a reduced-complexity decoding scheme, the fourth number of carriers may be greater than the first number of carriers, and/or the fifth number of RBs in band may be greater than the second number of RBs in band.

Such a wireless device may semi-statically configure the decoder per CC and/or per band. The decoder may be configured to have regular decoding or reduced complexity decoding. The decoder configuration per CC and/or per band may be based on a configuration from another wireless device, such as a network entity's configuration of a UE's decoder configuration per CC and/or per band. The wireless device may dynamically determine a decoder type based on an instantaneously scheduled throughput per CC and/or per band. The wireless device may dynamically determine a decoder type based on whether one or more of the following conditions are satisfied: (a) the coding rate meets or exceeds a threshold value (e.g., ⅔, ¾, or ⅘), (b) the TB size meets or exceeds a threshold size, (c) the number of code blocks (CBs) per TB meets or exceeds a threshold value, (d) the modulation and coding scheme (MCS) meets or exceeds a threshold value, (e) the modulation order meets or exceeds a threshold value (e.g., 64 quadrature amplitude modulation (64QAM) or above), the number of layers for transmission meets or exceeds a threshold value, (f) the first BG may be used for DL but not for UL, (g) the first BG may be used for UL but not for DL, (h) the first BG may be used for sidelink but not for UL or DL, or (i) the first BG may be authorized to be used when limited buffer rate matching (LBRM) is enabled for a specified TB.

In some aspects, a wireless device may be configured to indicate its capability so that the instantaneous maximum data rate does not exceed the throughput indicated for a reduced-capacity decoding indicated in the capability. In some aspects, if regular decoding is semi-statically configured by a second wireless device to a first wireless device (e.g., by a network entity to a UE), the instantaneous maximum data rate may not exceed the throughput indicated for the regular decoding indicated in the capability.

A performance test may be defined for a first decoding complexity (e.g., a regular decoding complexity) vs. a second decoding complexity (e.g., a reduced complexity decoding scheme). Similarly, a performance test may be defined for a first receiver (e.g., a regular receiver) vs. a second receiver (e.g., a reduced complexity receiver). A receiver may contain both a decoder and also additional components of a receiver chain, such as a demodulation component. A wireless device that uses a designated receiver to receive a transmission may be considered to be set in a receiver mode for that receiver. In one aspect, the performance may be defined in terms of a reference sensitivity power level. The reference sensitivity power level may be the minimum mean power applied to each one of the antenna ports for a wireless device, such as a UE, at which the throughput may meet or exceed the requirements for the specified reference measurement channel. For example, a performance may be defined as a throughput that meets or exceeds 95% of the maximum throughput of the reference measurement channel at a received power equal to, or greater than, the reference sensitivity power level. A first decoding complexity (e.g., a reduced complexity decoding scheme) may have a reference sensitivity power level that is higher than the reference sensitivity power level of a second decoding complexity (e.g., a regular, non-reduced complexity decoding scheme). In other words, the reference sensitivity power level for the first decoder (e.g., a reduced-complexity decoder) may be defined as the power delta from the sensitivity power level of a reference decoder (e.g., a regular decoder). In another aspect, the reference sensitivity power level for a first receiver (e.g., a reduced-complexity receiver) may be defined as the power delta from the sensitivity power level of a reference receiver (e.g., a regular receiver).

The results of the performance test may be used to determine a configuration for the wireless device to use. For example, a base graph may be selected based on a result of a comparison of the throughput to the threshold. The wireless device may select the configuration based on the results of the performance test, or another wireless device, such as a network entity, may output a configuration for the wireless device to use. For example, a performance test may indicate a support for a capability for a base graph associated with a level of a decoding capacity or a receiver mode—one for each decoding capacity and/or receiver mode. A decoding complexity or a receiver mode may be selected based on a configuration parameter of the wireless device. For example, a first level of a decoding complexity or a first level of a receiver mode may be used when the wireless device is configured with a first number of frequency bands or CCs that meet or are larger than a threshold value, and a second level of a decoding capacity or a second level of a receiver mode may be used when the wireless device is configured with a second number of frequency bands or CCs that meet or are less than a threshold value.

Figure 7:
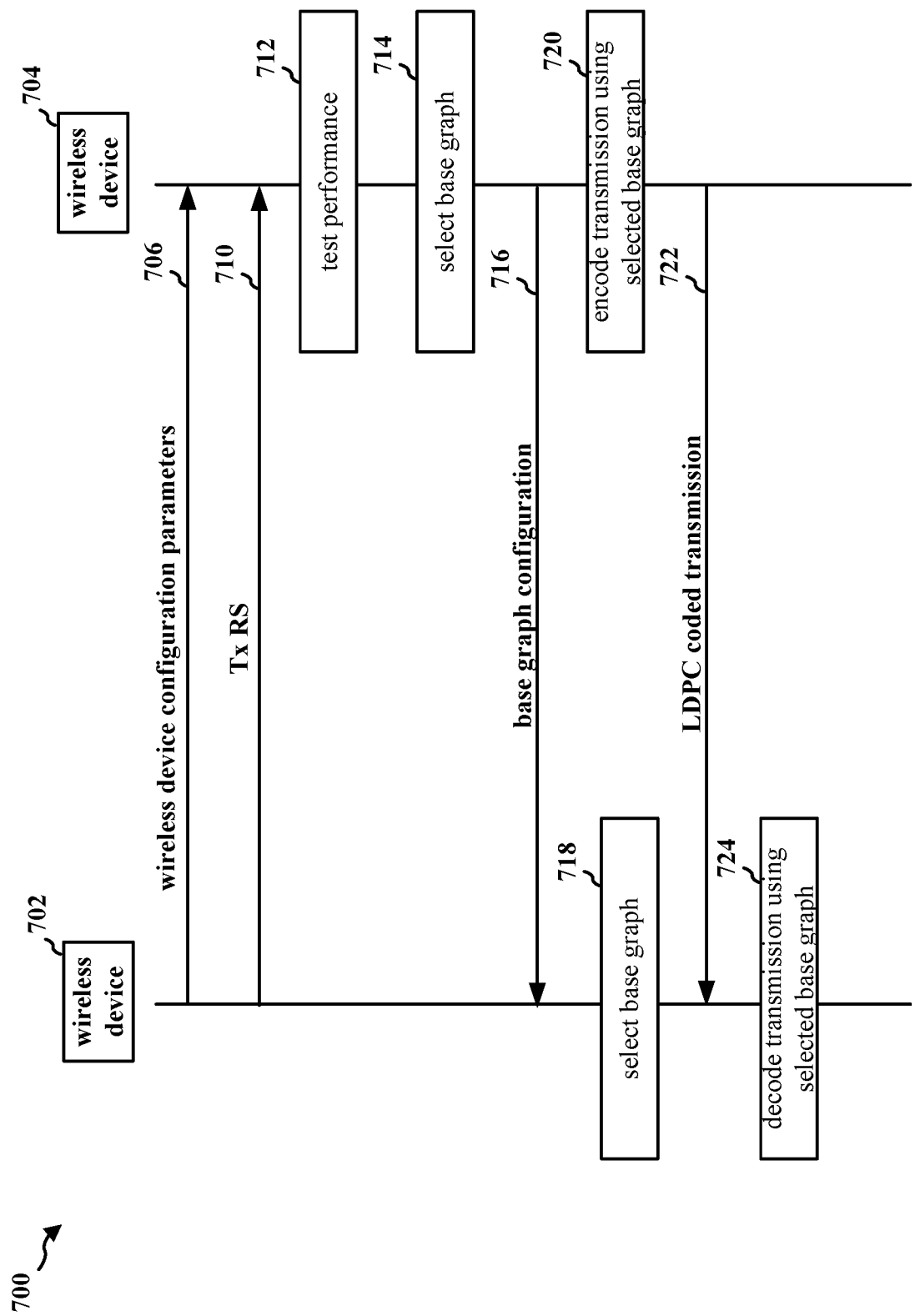
FIG. 7 is a network connection flow diagram illustrating an example of a pair of wireless devices configured to select an LDPC base graph in accordance with various aspects of the present disclosure.

FIG. 7 shows a network connection flow diagram 700 illustrating a wireless device 702 and a wireless device 704. The wireless device 702 may be a UE or a network entity. The wireless device 704 may be a UE or a network entity. The wireless device 704 may be configured to select a base graph at 714 for use by the wireless device 702 to decode the LDPC coded transmission 722.

The wireless device 702 may be configured to output the wireless device configuration parameters 706 to the wireless device 704. The wireless device configuration parameters may include, for example, a decoding complexity of the wireless device 702, a device category of the wireless device 702, a capability of the wireless device 702, a decoder mode of the wireless device 702, a receiver complexity of the wireless device 702, a receiver mode of the wireless device 702, a power consumption of the wireless device 702, a power mode of the wireless device 702, an indication from the wireless device 702, a first bandwidth of a CC, a second bandwidth of a transmission, one or more CQI reports corresponding with one or more BGs of the wireless device 702, a number of iterations at which one BG performs better than another BG, a threshold metric for a BG, a performance of a code instance generated by a BG of the wireless device 702, a minimum coding rate supported by a BG at a number of iterations, a performance of a BG when using an order of modulation, a coding rate of the wireless device 702, a TB size of the wireless device 702, a number of CBs per TB of the wireless device 702, an MCS value of an MCS of the wireless device 702, a number of layers for transmission to the wireless device 702, whether a BG of the wireless device 702 may be used for DL but not for UL, whether a BG of the wireless device 702 may be used for UL but not for DL, whether a BG of the wireless device 702 may be used for sidelink but not for Uu links, or whether a BG may be authorized when LBRM is enabled for a TB of the wireless device 702. The decoding complexity of the wireless device 702 may include, for example, a number of code blocks per transport block, an MCS, a modulation order, a number of layers for the transmission, a direction of communication being uplink, downlink, or sidelink, a limited buffer rate matching being enabled for a transport block, a maximum number of MIMO layers that is configured on a CC, or a highest modulation order configured in a CC.

The one or more CQI reports may each correspond to a different BG. For example, the wireless device 702 may generate a first CQI report for a first BG and a second CQI report for a second BG. The wireless device 702 may generate CQI reports that report absolute CQI values in each report. In another aspect, the wireless device 702 may generate one CQI report that reports one or more absolute CQI values, and another CQI report that indicates the performance delta between the first BG and the second BG. In one aspect, if the wireless device 702 is configured to use a low complexity decoder, the CQI may indicate a better performance for the first BG, and in another aspect, if the wireless device 702 is configured to use a high complexity decoder, the CQI may indicate a worse performance for the first BG.

The indication may include, for example, a base graph preference for the wireless device 702, decoder information for the wireless device 702, capability support for one or more base graphs of the wireless device 702 (e.g., support for a capability for a base graph associated with a level of a decoding capacity or a receiver mode), or a throughput of a reference measurement channel of the wireless device 702.

The decoder information for the wireless device 702 may include, for example, a decoder mode of the wireless device 702 (i.e., which decoder complexity the wireless device 702 is using), a power mode of the wireless device 702, an amount of decoder iterations that the wireless device 702 uses to decode an incoming transmission, such as the LDPC coded transmission 722, or a quantity of bits for LLR quantization at the wireless device 702.

The wireless device 702 may also send one or more Tx reference signals (RS) 710 to the wireless device 704. At 712 the wireless device 704 may test a performance of the wireless device 702. For example, the wireless device 704 may test a throughput of the Tx RS signals, or may a reference sensitivity power level of the wireless device 702. For example, the wireless device 704 may determine a minimum mean power applied to each one of the antenna ports of the wireless device 702 at which the throughput may meet or exceed requirements for a specified reference measurement channel. In some aspects, the wireless device 704 may perform a PEXIT analysis to compute one or more thresholds for the wireless device 702. In some aspects, the wireless device 704 may compare a measured throughput to a threshold of a reference measurement channel based on a reference sensitivity power level. If the comparison of the measured throughput meets or is above the threshold, a first BS may be selected, and if the comparison of the measured throughput meets or is below the threshold, a second BS may be selected.

At 714, the wireless device 704 may select a base graph based on one or more of the wireless device configuration parameters 706 or the results of the performance test at 712. The wireless device 704 may output the base graph configuration 716 to the wireless device 702, and the wireless device 702 may obtain the base graph configuration 716. The base graph configuration 716 may include a selection of a base graph selected by the wireless device at 714. The base graph configuration 716 may include one or more parameters that may be used by the wireless device 702 to select a base graph.

At 718, the wireless device 702 may select a base graph to use based on the base graph configuration 716. Where the base graph configuration 716 includes a selection of the base graph, the wireless device 702 may select the base graph indicated by the base graph configuration 716. Where the base graph configuration 716 include one or more parameters that may be used by the wireless device 702 to select a base graph, the wireless device 702 may select a base graph based on the parameters of the base graph configuration 716. For example, the base graph configuration may include, for example, an indication of support for a first capability for a first base graph associated with a first level of the decoding complexity or a first receiver mode and may include an indication of support for a second capability for a second base graph associated with a second level of the decoding complexity or a second receiver mode. The wireless device 702 may then use the first level of the decoding complexity or the first receiver mode when the wireless device 702 is configured with a first number of frequency bands or CCs that are larger than a threshold value (the threshold value may be preconfigured by the wireless device 702 or may be provided in the base graph configuration 716), or the wireless device 702 may use the second level of the decoding complexity or the second receiver mode when the second device is configured with a second number of frequency bands or CCs that are smaller than the threshold value.

At 720, the wireless device 704 may encode a transmission using the selected base graph. The wireless device 704 may output the LDPC coded transmission 722 to the wireless device 702. The wireless device 702 may obtain the LDPC coded transmission 722 from the wireless device 704. At 724, the wireless device 702 may decode the LDPC coded transmission 722 using the selected base graph.

Figure 8:
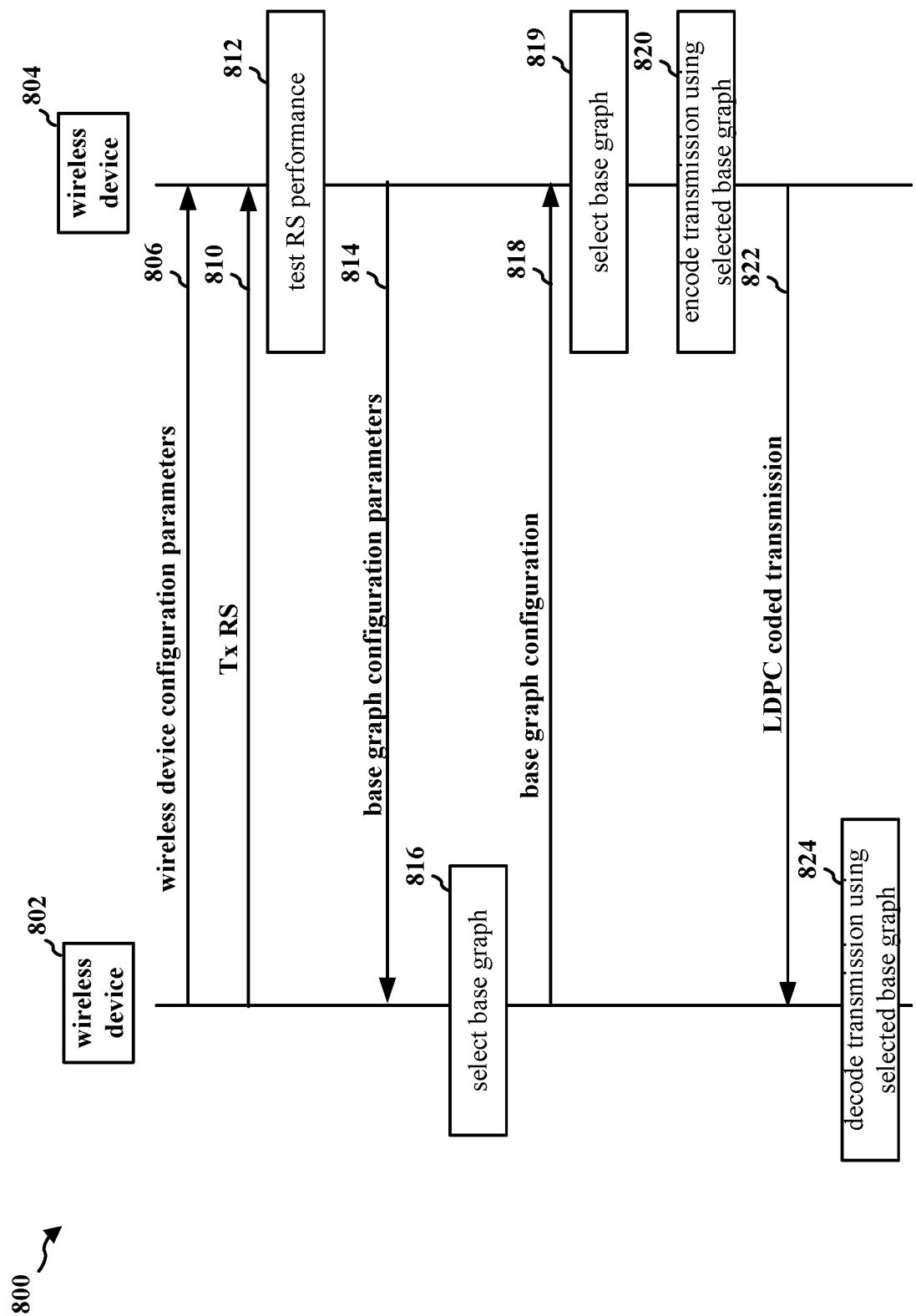
FIG. 8 is a network connection flow diagram illustrating an example of another pair of wireless devices configured to select an LDPC base graph in accordance with various aspects of the present disclosure.

FIG. 8 shows a network connection flow diagram 800 illustrating a wireless device 802 and a wireless device 804. The wireless device 802 may be a UE or a network entity. The wireless device 804 may be a UE or a network entity. The wireless device 802 may be configured to select a base graph at 816 to indicate to the wireless device 804 what base graph is used by the wireless device 802 to decode the LDPC coded transmission 822.

The wireless device 802 may be configured to output the wireless device configuration parameters 806 to the wireless device 804. The wireless device configuration parameters may include, for example, a decoding complexity of the wireless device 802, a device category of the wireless device 802, a capability of the wireless device 802, a decoder mode of the wireless device 802, a receiver complexity of the wireless device 802, a receiver mode of the wireless device 802, a power consumption of the wireless device 802, a power mode of the wireless device 802, an indication from the wireless device 802, a first bandwidth of a CC, a second bandwidth of a transmission, one or more CQI reports corresponding with one or more BGs of the wireless device 802, a number of iterations at which one BG performs better than another BG, a threshold metric for a BG, a performance of a code instance generated by a BG of the wireless device 802, a minimum coding rate supported by a BG at a number of iterations, a performance of a BG when using an order of modulation, a coding rate of the wireless device 802, a TB size of the wireless device 802, a number of CBs per TB of the wireless device 802, an MCS value of an MCS of the wireless device 802, a number of layers for transmission to the wireless device 802, whether a BG of the wireless device 802 may be used for DL but not for UL, whether a BG of the wireless device 802 may be used for UL but not for DL, whether a BG of the wireless device 802 may be used for sidelink but not for Uu links, or whether a BG may be authorized when LBRM is enabled for a TB of the wireless device 802. The decoding complexity of the wireless device 802 may include, for example, a number of code blocks per transport block, an MCS, a modulation order, a number of layers for the transmission, a direction of communication being uplink, downlink, or sidelink, a limited buffer rate matching being enabled for a transport block, a maximum number of MIMO layers that are configured on a CC, or a highest modulation order configured in a CC.

The one or more CQI reports may each correspond to a different BG. For example, the wireless device 802 may generate a first CQI report for a first BG and a second CQI report for a second BG. The wireless device 802 may generate CQI reports that report absolute CQI values in each report. In another aspect, the wireless device 802 may generate one CQI report that reports one or more absolute CQI values, and another CQI report that indicates the performance delta between the first BG and the second BG. In one aspect, if the wireless device 802 is configured to use a low complexity decoder, the CQI may indicate a better performance for the first BG, and in another aspect, if the wireless device 802 is configured to use a high complexity decoder, the CQI may indicate a worse performance for the first BG.

The indication may include, for example, a base graph preference for the wireless device 802, decoder information for the wireless device 802, capability support for one or more base graphs of the wireless device 802 (e.g., support for a capability for a base graph associated with a level of a decoding capacity or a receiver mode), or a throughput of a reference measurement channel of the wireless device 802. The decoder information for the wireless device 802 may include, for example, a decoder mode of the wireless device 802 (i.e., which decoder complexity the wireless device 802 is using), a power mode of the wireless device 802, an amount of decoder iterations that the wireless device 802 uses to decode an incoming transmission, such as the LDPC coded transmission 822, or a quantity of bits for LLR quantization at the wireless device 802.

The wireless device 802 may also send one or more Tx reference signals (RS) 810 to the wireless device 804. At 812 the wireless device 804 may test a performance of the wireless device 802. For example, the wireless device 804 may test a throughput of the Tx RS signals, or may a reference sensitivity power level of the wireless device 802. For example, the wireless device 804 may determine a minimum mean power applied to each one of the antenna ports of the wireless device 802 at which the throughput may meet or exceed requirements for a specified reference measurement channel. In some aspects, the wireless device 804 may perform a PEXIT analysis to compute one or more thresholds for the wireless device 802. In some aspects, the wireless device 804 may compare a measured throughput to a threshold of a reference measurement channel based on a reference sensitivity power level. If the comparison of the measured throughput meets or is above the threshold, a first BS may be selected, and if the comparison of the measured throughput meets or is below the threshold, a second BS may be selected.

The wireless device 804 may output one or more base graph configuration parameters 814 to the wireless device 802, and the wireless device 802 may obtain the one or more base graph configuration parameters 814. The one or more base graph configuration parameters 814 may include one or more parameters that may be used by the wireless device 802 to select a base graph. The one or more base graph configuration parameters 814 may include, for example, performance test results from the performance test at 812.

At 816 the wireless device 802 may select a base graph based on at least one or more of the wireless device configuration parameters 806, parameters of the wireless device 802 that were not sent to the wireless device 804, and/or the one or more base graph configuration parameters 814. For example, the wireless device 802 may select a base graph based on a number of iterations the wireless device 802 is using for its decoder, or may select a base graph based on a low power mode to minimize a complexity of the decoder used by the wireless device 802. In another aspect, the wireless device 802 may select a base graph based on the one or more base graph configuration parameters 814. For example, the base graph configuration may include, for example, an indication of support for a first capability for a first base graph associated with a first level of the decoding complexity or a first receiver mode and may include an indication of support for a second capability for a second base graph associated with a second level of the decoding complexity or a second receiver mode. The wireless device 802 may then use the first level of the decoding complexity or the first receiver mode when the wireless device 802 is configured with a first number of frequency bands or CCs that are larger than a threshold value (the threshold value may be preconfigured by the wireless device 802 or may be provided in the one or more base graph configuration parameters 814), or the wireless device 802 may use the second level of the decoding complexity or the second receiver mode when the second device is configured with a second number of frequency bands or CCs that are smaller than the threshold value.

The wireless device 802 may be configured to switch its mode to match the base graph selected at 816. For example, where the base graph selected at 816 is associated with a decoder mode (e.g., a regular decoder complexity, a lower decoder complexity, a higher decoder complexity), the wireless device 802 may be configured to switch the decoder mode for the wireless device 802 to a decoder mode that is associated with the selected base graph. Where the base graph selected at 816 is associated with a power mode (e.g., a low power mode, a regular power mode, a high power mode) the wireless device 802 may be configured to switch the decoder mode for the wireless device 802 to a decoder mode that is associated with the selected base graph (e.g., a low complexity base graph with a low power mode, a high complexity base graph with a high power mode).

The wireless device 802 may output the base graph configuration 818 to the wireless device 804. The wireless device 804 may obtain the base graph configuration 818 from the wireless device 802. At 819, the wireless device 804 may select the base graph based on the base graph configuration 818. The base graph configuration 818 may include an indication of the base graph selected by the wireless device 802. The base graph configuration 818 may include an indication of a base graph preference of the wireless device 802.

At 820, the wireless device 804 may encode a transmission using the selected base graph. The wireless device 804 may output the LDPC coded transmission 822 to the wireless device 802. The wireless device 802 may obtain the LDPC coded transmission 822 from the wireless device 804. At 824, the wireless device 802 may decode the LDPC coded transmission 822 using the selected base graph.

Figure 9:
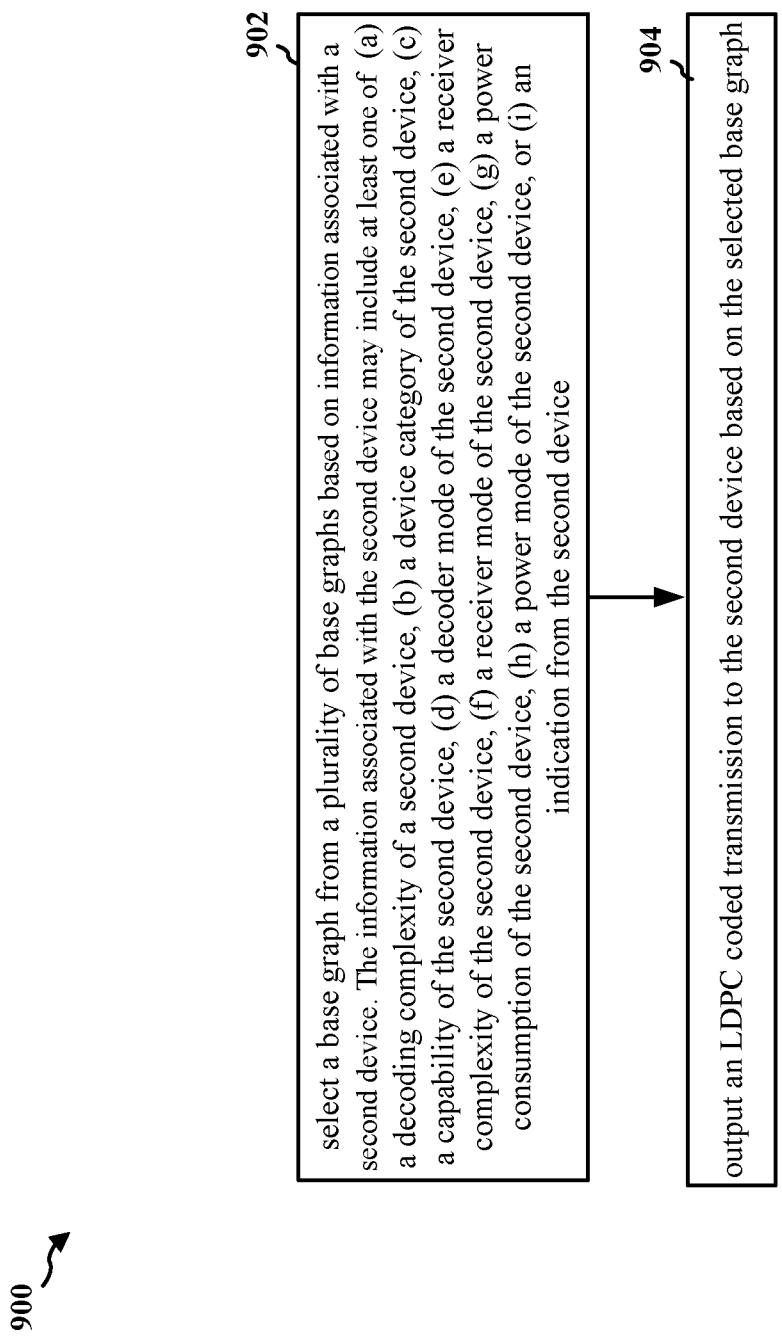
FIG. 9 is a flowchart of a method of wireless communication.

FIG. 9 is a flowchart 900 of a method of wireless communication. The method may be performed by a first wireless device (e.g., the UE 104, UE 350; base station 102, base station 310; the wireless device 702, the wireless device 704, the wireless device 802, the wireless device 804; the apparatus 1404; the network entity 1402, the network entity 1502). At 902, the first wireless device may select a base graph from a plurality of base graphs based on information associated with a second device. The information associated with the second device may include at least one of (a) a decoding complexity of a second device, (b) a device category of the second device, (c) a capability of the second device, (d) a decoder mode of the second device, (e) a receiver complexity of the second device, (f) a receiver mode of the second device, (g) a power consumption of the second device, (h) a power mode of the second device, or (i) an indication from the second device. For example, 902 may be performed by the wireless device 704 in FIG. 7, which may select a base graph at 714 based on based on information associated with the wireless device 702. The information associated with the wireless device 702 may include at least one of (a) a decoding complexity of the wireless device 702, (b) a device category of the wireless device 702, (c) a capability of the wireless device 702, (d) a decoder mode of the wireless device 702, (e) a receiver complexity of the wireless device 702, (f) a receiver mode of the wireless device 702, (g) a power consumption of the wireless device 702, (h) a power mode of the wireless device 702, or (i) an indication from the wireless device 702. 902 may also be performed by component 198 in FIG. 14 or in FIG. 15.

At 904, the first wireless device may output an LDPC coded transmission to the second device based on the selected base graph. For example, 904 may be performed by the wireless device 704 in FIG. 7, which may output an LDPC coded transmission 722 to the wireless device 702 based on the base graph selected at 714. 904 may also be performed by component 198 in FIG. 14 or in FIG. 15.

Figure 10:
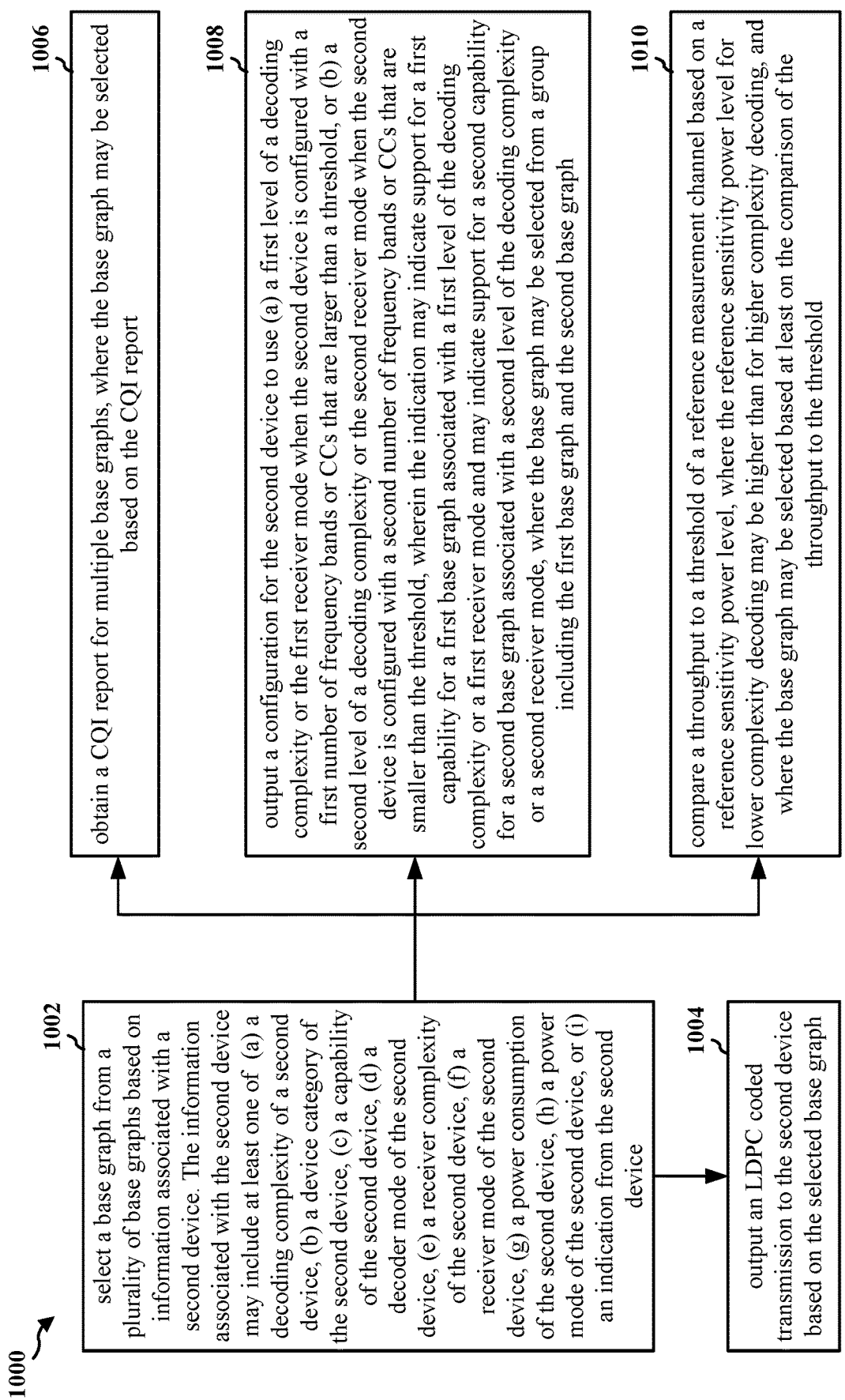
FIG. 10 is a flowchart of a method of wireless communication.

FIG. 10 is a flowchart 1000 of a method of wireless communication. The method may be performed by a first wireless device (e.g., the UE 104, UE 350; base station 102, base station 310; the wireless device 702, the wireless device 704, the wireless device 802, the wireless device 804; the apparatus 1404; the network entity 1402, the network entity 1502). At 1002, the first wireless device may select a base graph from a plurality of base graphs based on information associated with a second device. The information associated with the second device may include at least one of (a) a decoding complexity of a second device, (b) a device category of the second device, (c) a capability of the second device, (d) a decoder mode of the second device, (e) a receiver complexity of the second device, (f) a receiver mode of the second device, (g) a power consumption of the second device, (h) a power mode of the second device, or (i) an indication from the second device. For example, 902 may be performed by the wireless device 704 in FIG. 7, which may select a base graph at 714 based on based on information associated with the wireless device 702. The information associated with the wireless device 702 may include at least one of (a) a decoding complexity of the wireless device 702, (b) a device category of the wireless device 702, (c) a capability of the wireless device 702, (d) a decoder mode of the wireless device 702, (e) a receiver complexity of the wireless device 702, (f) a receiver mode of the wireless device 702, (g) a power consumption of the wireless device 702, (h) a power mode of the wireless device 702, or (i) an indication from the wireless device 702. 1002 may also be performed by component 198 in FIG. 14 or in FIG. 15.

At 1006, the first wireless device may obtain a CQI report for multiple base graphs. The base graph may be selected based on the CQI report. For example, 1006 may be performed by the wireless device 704 in FIG. 7, which may obtain a CQI report for multiple base graphs as the wireless device configuration parameters 706. The base graph may be selected at 714 based on the CQI report. 1006 may also be performed by component 198 in FIG. 14 or in FIG. 15.

At 1008, the first wireless device may output a configuration for the second device to use (a) a first level of a decoding complexity or the first receiver mode when the second device is configured with a first number of frequency bands or CCs that are larger than a threshold, or (b) a second level of a decoding complexity or the second receiver mode when the second device is configured with a second number of frequency bands or CCs that are smaller than the threshold. The indication may indicate support for a first capability for a first base graph associated with a first level of the decoding complexity or a first receiver mode and may indicate support for a second capability for a second base graph associated with a second level of the decoding complexity or a second receiver mode, where the base graph may be selected from a group including the first base graph and the second base graph. For example, 1008 may be performed by the wireless device 704 in FIG. 7, which may output a base graph configuration 716 for the wireless device 702 to use (a) a first level of a decoding complexity or the first receiver mode when the second device is configured with a first number of frequency bands or CCs that are larger than a threshold, or (b) a second level of a decoding complexity or the second receiver mode when the second device is configured with a second number of frequency bands or CCs that are smaller than the threshold. The indication in the wireless device configuration parameters 706 may indicate support for a first capability for a first base graph associated with a first level of the decoding complexity or a first receiver mode. The indication in the wireless device configuration parameters 706 may indicate support for a second capability for a second base graph associated with a second level of the decoding complexity or a second receiver mode, where the base graph may be selected from a group including the first base graph and the second base graph. 1008 may also be performed by component 198 in FIG. 14 or in FIG. 15.

At 1010, the first wireless device may compare a throughput to a threshold of a reference measurement channel based on a reference sensitivity power level. The reference sensitivity power level for lower complexity decoding may be higher than for higher complexity decoding. The base graph may be selected based at least on the comparison of the throughput to the threshold. For example, 1010 may be performed by the wireless device 704 in FIG. 7, which may compare a throughput of the Tx RS 710 at 712 to a threshold of a reference measurement channel based on a reference sensitivity power level. The reference sensitivity power level for lower complexity decoding may be higher than for higher complexity decoding. The base graph may be selected at 714 based at least on the comparison of the throughput to the threshold. 1010 may also be performed by component 198 in FIG. 14 or in FIG. 15.

At 1004, the first wireless device may output an LDPC coded transmission to the second device based on the selected base graph. For example, 1004 may be performed by the wireless device 704 in FIG. 7, which may output an LDPC coded transmission 722 to the wireless device 702 based on the base graph selected at 714. 1004 may also be performed by component 198 in FIG. 14 or in FIG. 15.

Figure 11:
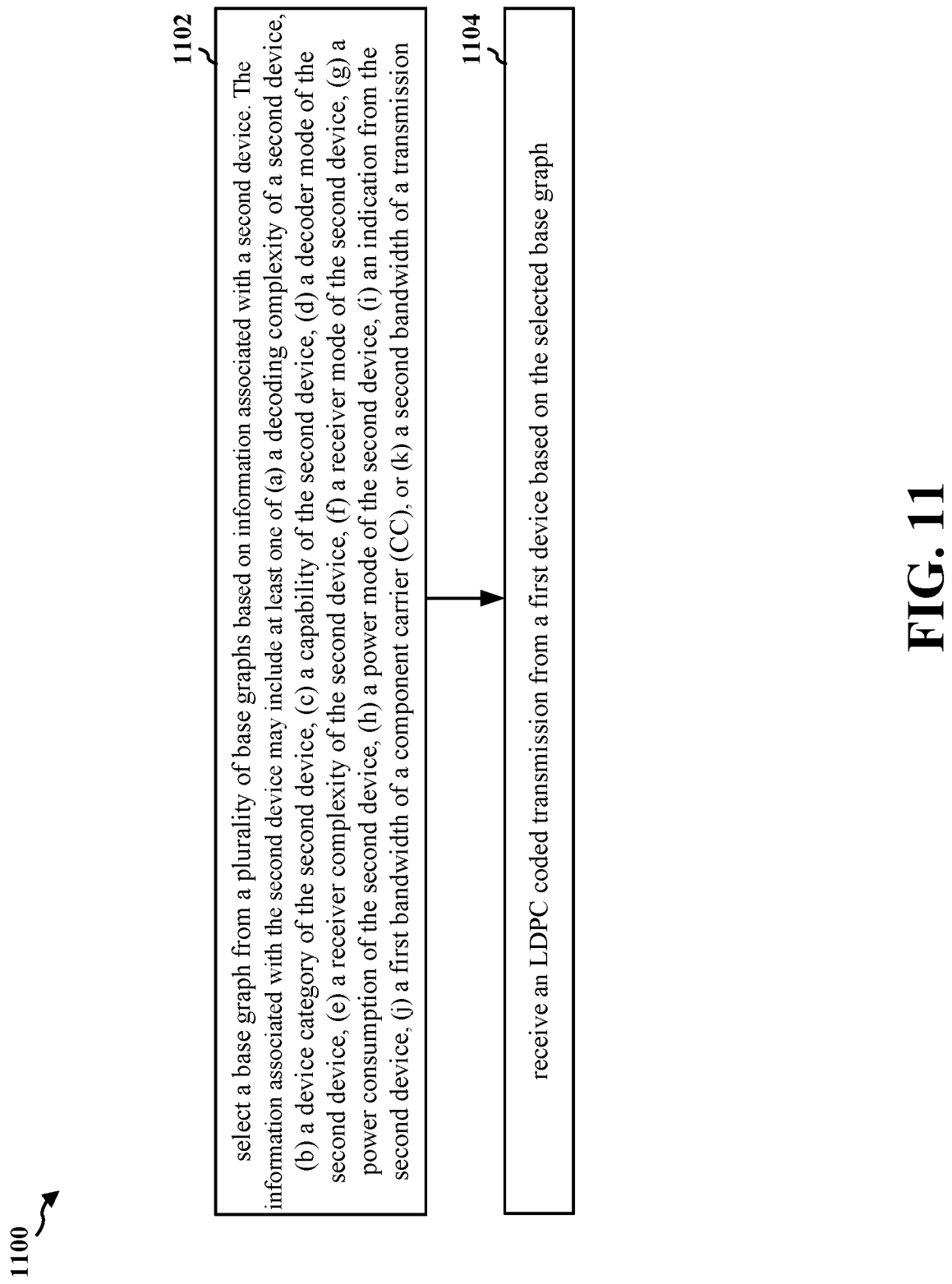
FIG. 11 is a flowchart of a method of wireless communication.

FIG. 11 is a flowchart 1100 of a method of wireless communication. The method may be performed by a second wireless device (e.g., the UE 104, UE 350; base station 102, base station 310; the wireless device 702, the wireless device 704, the wireless device 802, the wireless device 804; the apparatus 1404; the network entity 1402, the network entity 1502). At 1102, the second wireless device may select a base graph from a plurality of base graphs based on information associated with the second wireless device. The information associated with the second wireless device may include at least one of (a) a decoding complexity of a second device, (b) a device category of the second device, (c) a capability of the second device, (d) a decoder mode of the second device, (e) a receiver complexity of the second device, (f) a receiver mode of the second device, (g) a power consumption of the second device, (h) a power mode of the second device, (i) an indication from the second device, (j) a first bandwidth of a CC, or (k) a second bandwidth of a transmission. For example, 1102 may be performed by the wireless device 802 in FIG. 8, which may select a base graph at 816 from a plurality of base graphs based on information associated with the wireless device 802. The information associated with the wireless device 802 may include at least one of (a) a decoding complexity of a second device, (b) a device category of the second device, (c) a capability of the second device, (d) a decoder mode of the second device, (e) a receiver complexity of the second device, (f) a receiver mode of the second device, (g) a power consumption of the second device, (h) a power mode of the second device, (i) an indication from the second device, (j) a first bandwidth of a CC, or (k) a second bandwidth of a transmission. 1102 may also be performed by component 199 in FIG. 14 or in FIG. 15.

At 1104, the second wireless device may receive an LDPC coded transmission from a first device based on the selected base graph. For example, 1104 may be performed by the wireless device 802 in FIG. 8, which may receive an LDPC coded transmission 822 from the wireless device 804 based on the base graph selected at 816. 1104 may also be performed by component 199 in FIG. 14 or in FIG. 15.

Figure 12:
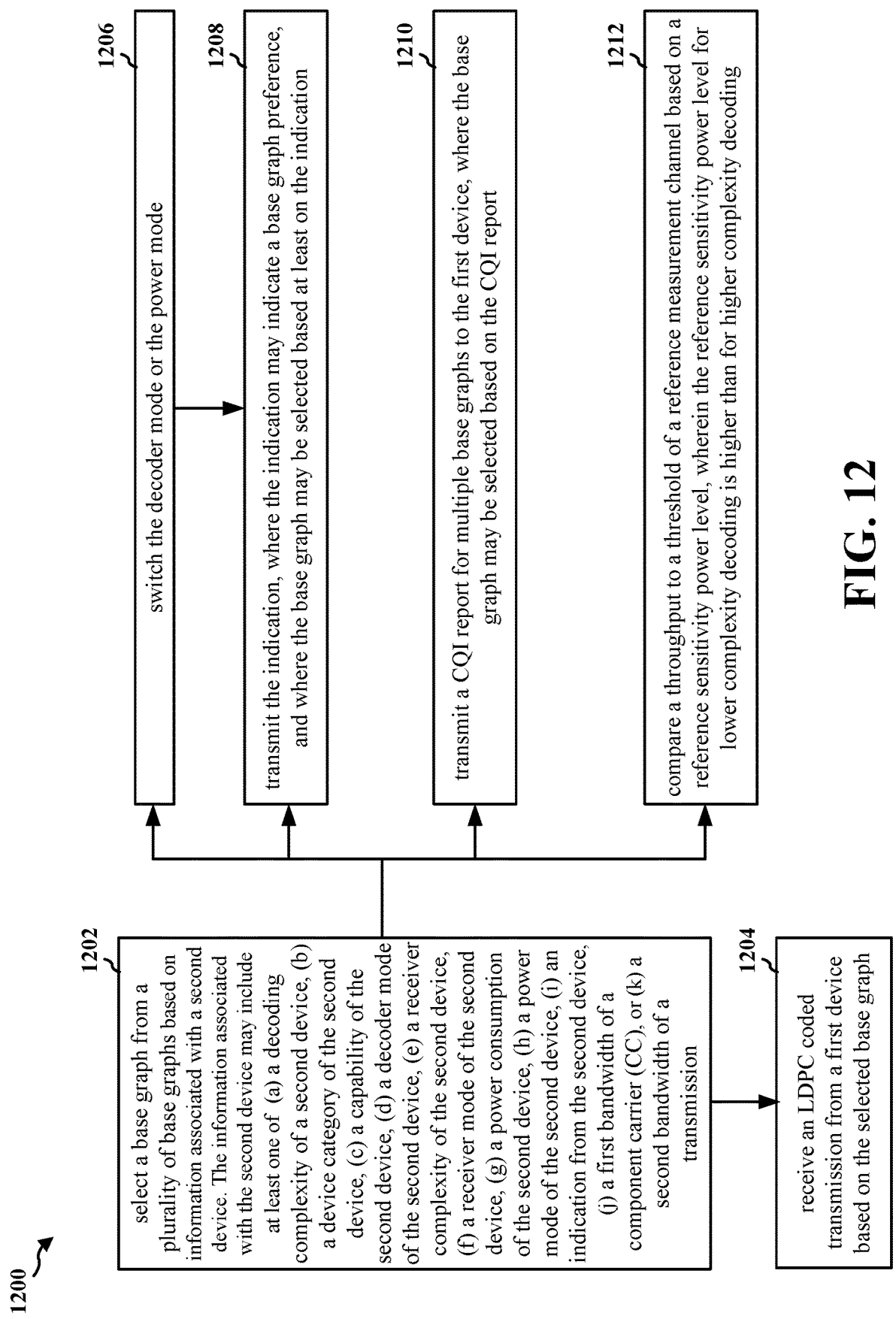
FIG. 12 is a flowchart of a method of wireless communication.

FIG. 12 is a flowchart 1200 of a method of wireless communication. The method may be performed by a second wireless device (e.g., the UE 104, UE 350; base station 102, base station 310; the wireless device 702, the wireless device 704, the wireless device 802, the wireless device 804; the apparatus 1404; the network entity 1402, the network entity 1502). At 1202, the second wireless device may select a base graph from a plurality of base graphs based on information associated with the second wireless device. The information associated with the second wireless device may include at least one of (a) a decoding complexity of a second device, (b) a device category of the second device, (c) a capability of the second device, (d) a decoder mode of the second device, (e) a receiver complexity of the second device, (f) a receiver mode of the second device, (g) a power consumption of the second device, (h) a power mode of the second device, (i) an indication from the second device, (j) a first bandwidth of a CC, or (k) a second bandwidth of a transmission. For example, 1102 may be performed by the wireless device 802 in FIG. 8, which may select a base graph at 816 from a plurality of base graphs based on information associated with the wireless device 802. The information associated with the wireless device 802 may include at least one of (a) a decoding complexity of a second device, (b) a device category of the second device, (c) a capability of the second device, (d) a decoder mode of the second device, (e) a receiver complexity of the second device, (f) a receiver mode of the second device, (g) a power consumption of the second device, (h) a power mode of the second device, (i) an indication from the second device, (j) a first bandwidth of a CC, or (k) a second bandwidth of a transmission. 1202 may also be performed by component 199 in FIG. 14 or in FIG. 15.

At 1206, the second wireless device may switch the decoder mode or the power mode. For example, 1206 may be performed by the wireless device 802 in FIG. 8, which may be switch the decoder mode or the power mode to one associated with the base graph selected at 816. 1206 may also be performed by component 199 in FIG. 14 or in FIG. 15.

At 1208, the second wireless device may transmit the indication. The indication may indicate a base graph preference. The base graph may be selected based at least on the indication. For example, 1208 may be performed by the wireless device 802 in FIG. 8, which may transmit the indication as the base graph configuration 818. The indication may indicate a base graph preference as the base graph selected in 816. The base graph may be selected at 819 based on the base graph configuration 818. 1208 may also be performed by component 199 in FIG. 14 or in FIG. 15.

At 1210, the second wireless device may transmit a CQI report for multiple base graphs to the first device. The base graph may be selected based on the CQI report. For example, 1210 may be performed by the wireless device 802 in FIG. 8, which may transmit a CQI report for multiple base graphs as the wireless device configuration parameters 806 to the wireless device 804. The base graph may be selected at 816 based on the CQI report. 1210 may also be performed by component 199 in FIG. 14 or in FIG. 15.

At 1212, the second wireless device may compare a throughput to a threshold of a reference measurement channel based on a reference sensitivity power level. The reference sensitivity power level for lower complexity decoding is higher than for higher complexity decoding. For example, 1212 may be performed by the wireless device 802 in FIG. 8, which may compare a throughput received as the one or more base graph configuration parameters 814 to a threshold of a reference measurement channel based on a reference sensitivity power level measured at 812. The reference sensitivity power level for lower complexity decoding may be higher than for higher complexity decoding. 1212 may also be performed by component 199 in FIG. 14 or in FIG. 15.

At 1204, the second wireless device may receive an LDPC coded transmission from a first device based on the selected base graph. For example, 1204 may be performed by the wireless device 802 in FIG. 8, which may receive an LDPC coded transmission 822 from the wireless device 804 based on the base graph selected at 816. 1204 may also be performed by component 199 in FIG. 14 or in FIG. 15.

Figure 13:
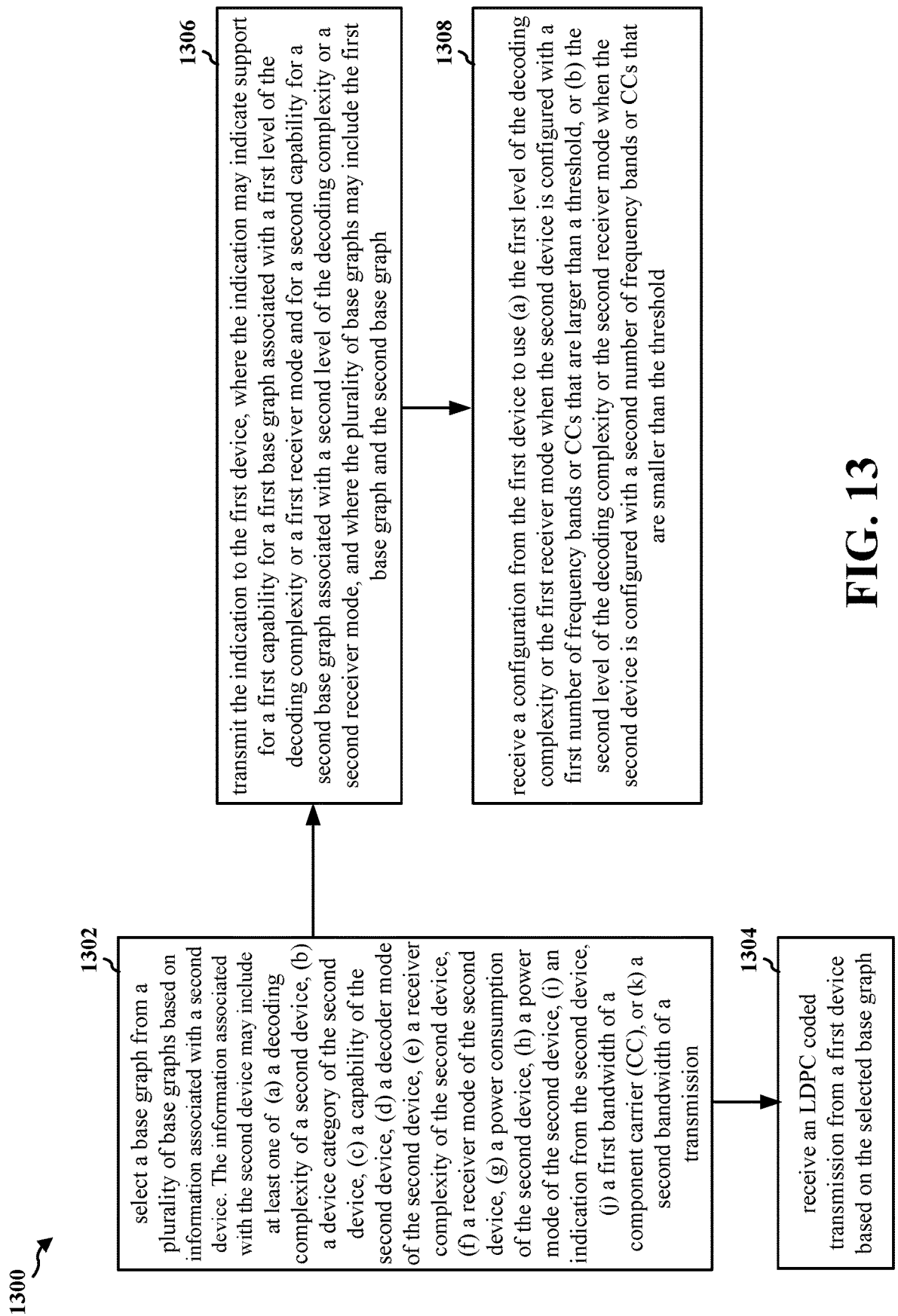
FIG. 13 is a flowchart of a method of wireless communication.

FIG. 13 is a flowchart 1300 of a method of wireless communication. The method may be performed by a second wireless device (e.g., the UE 104, UE 350; base station 102, base station 310; the wireless device 702, the wireless device 704, the wireless device 802, the wireless device 804; the apparatus 1404; the network entity 1402, the network entity 1502). At 1302, the second wireless device may select a base graph from a plurality of base graphs based on information associated with the second wireless device. The information associated with the second wireless device may include at least one of (a) a decoding complexity of a second device, (b) a device category of the second device, (c) a capability of the second device, (d) a decoder mode of the second device, (e) a receiver complexity of the second device, (f) a receiver mode of the second device, (g) a power consumption of the second device, (h) a power mode of the second device, (i) an indication from the second device, (j) a first bandwidth of a CC, or (k) a second bandwidth of a transmission. For example, 1102 may be performed by the wireless device 802 in FIG. 8, which may select a base graph at 816 from a plurality of base graphs based on information associated with the wireless device 802. The information associated with the wireless device 802 may include at least one of (a) a decoding complexity of a second device, (b) a device category of the second device, (c) a capability of the second device, (d) a decoder mode of the second device, (e) a receiver complexity of the second device, (f) a receiver mode of the second device, (g) a power consumption of the second device, (h) a power mode of the second device, (i) an indication from the second device, (j) a first bandwidth of a CC, or (k) a second bandwidth of a transmission. 1302 may also be performed by component 199 in FIG. 14 or in FIG. 15.

At 1306, the second wireless device may transmit the indication to the first device. The indication may indicate support for a first capability for a first base graph associated with a first level of the decoding complexity or a first receiver mode and for a second capability for a second base graph associated with a second level of the decoding complexity or a second receiver mode. The plurality of base graphs may include the first base graph and the second base graph. For example, 1306 may be performed by the wireless device 802 in FIG. 8, which may transmit the indication as the base graph configuration 818 to the wireless device 804. The indication may indicate support for a first capability for a first base graph associated with a first level of the decoding complexity or a first receiver mode and for a second capability for a second base graph associated with a second level of the decoding complexity or a second receiver mode. The plurality of base graphs may include the first base graph and the second base graph. 1306 may also be performed by component 199 in FIG. 14 or in FIG. 15.

At 1308, the second wireless device may receive a configuration from the first device to use (a) the first level of the decoding complexity or the first receiver mode when the second device is configured with a first number of frequency bands or CCs that are larger than a threshold, or (b) the second level of the decoding complexity or the second receiver mode when the second device is configured with a second number of frequency bands or CCs that are smaller than the threshold. For example, 1308 may be performed by the wireless device 802 in FIG. 8, which may receive a configuration as the one or more base graph configuration parameters 814 from the wireless device 804 to use (a) the first level of the decoding complexity or the first receiver mode when the second device is configured with a first number of frequency bands or CCs that are larger than a threshold, or (b) the second level of the decoding complexity or the second receiver mode when the second device is configured with a second number of frequency bands or CCs that are smaller than the threshold. 1308 may also be performed by component 199 in FIG. 14 or in FIG. 15.

At 1304, the second wireless device may receive an LDPC coded transmission from a first device based on the selected base graph. For example, 1304 may be performed by the wireless device 802 in FIG. 8, which may receive an LDPC coded transmission 822 from the wireless device 804 based on the base graph selected at 816. 1304 may also be performed by component 199 in FIG. 14 or in FIG. 15.

Figure 14:
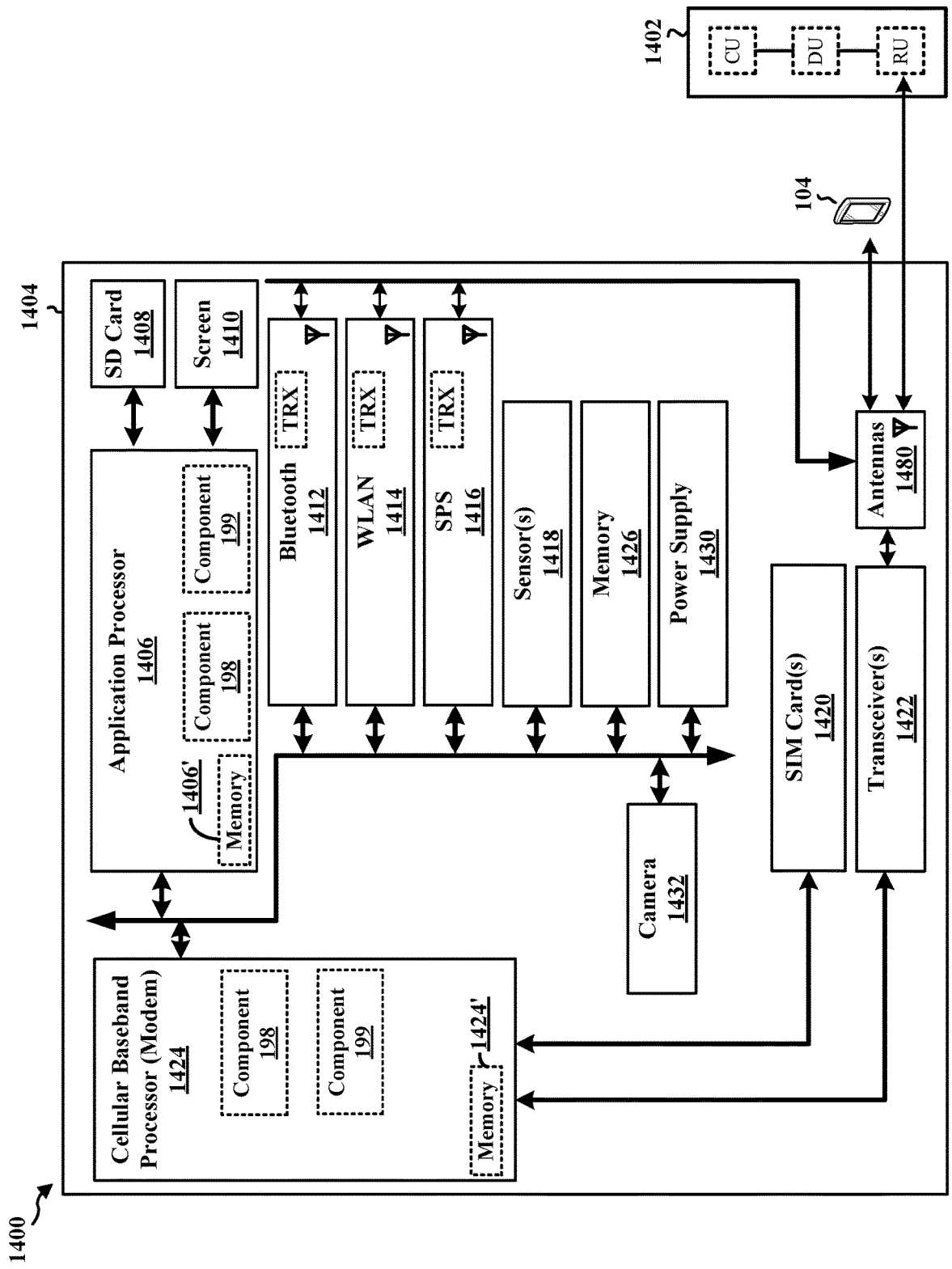
FIG. 14 is a diagram illustrating an example of a hardware implementation for an example apparatus and/or network entity.

FIG. 14 is a diagram 1400 illustrating an example of a hardware implementation for an apparatus 1404. The apparatus 1404 may be a UE, a component of a UE, or may implement UE functionality. In some aspects, the apparatus 1404 may include a cellular baseband processor 1424 (also referred to as a modem) coupled to one or more transceivers 1422 (e.g., cellular RF transceiver). The cellular baseband processor 1424 may include on-chip memory 1424'. In some aspects, the apparatus 1404 may further include one or more subscriber identity modules (SIM) cards 1420 and an application processor 1406 coupled to a secure digital (SD) card 1408 and a screen 1410. The application processor 1406 may include on-chip memory 1406'. In some aspects, the apparatus 1404 may further include a Bluetooth module 1412, a WLAN module 1414, an SPS module 1416 (e.g., GNSS module), one or more sensor modules 1418 (e.g., barometric pressure sensor/altimeter; motion sensor such as inertial management unit (IMU), gyroscope, and/or accelerometer(s); light detection and ranging (LIDAR), radio assisted detection and ranging (RADAR), sound navigation and ranging (SONAR), magnetometer, audio and/or other technologies used for positioning), additional memory modules 1426, a power supply 1430, and/or a camera 1432. The Bluetooth module 1412, the WLAN module 1414, and the SPS module 1416 may include an on-chip transceiver (TRx) (or in some cases, just a receiver (Rx)). The Bluetooth module 1412, the WLAN module 1414, and the SPS module 1416 may include their own dedicated antennas and/or utilize the antennas 1480 for communication. The cellular baseband processor 1424 communicates through the transceiver(s) 1422 via one or more antennas 1480 with the UE 104 and/or with an RU associated with a network entity 1402. The cellular baseband processor 1424 and the application processor 1406 may each include a computer-readable medium/memory 1424', 1406', respectively. The additional memory modules 1426 may also be considered a computer-readable medium/memory. Each computer-readable medium/memory 1424', 1406', 1426 may be non-transitory. The cellular baseband processor 1424 and the application processor 1406 are each responsible for general processing, including the execution of software stored on the computer-readable medium/memory. The software, when executed by the cellular baseband processor 1424/application processor 1406, causes the cellular baseband processor 1424/application processor 1406 to perform the various functions described supra. The computer-readable medium/memory may also be used for storing data that is manipulated by the cellular baseband processor 1424/application processor 1406 when executing software. The cellular baseband processor 1424/application processor 1406 may be a component of the UE 350 and may include the memory 360 and/or at least one of the Tx processor 368, the Rx processor 356, and the controller/processor 359. In one configuration, the apparatus 1404 may be a processor chip (modem and/or application) and include just the cellular baseband processor 1424 and/or the application processor 1406, and in another configuration, the apparatus 1404 may be the entire UE (e.g., see UE 350 of FIG. 3) and include the additional modules of the apparatus 1404.

As discussed supra, the component 198 is configured to select a base graph from a plurality of base graphs based on one or more of (a) a decoding complexity of a second device, (b) a device category of the second device, (c) a capability of the second device, (d) a decoder mode of the second device, (e) a receiver complexity of the second device, (f) a receiver mode of the second device, (g) a power consumption of the second device, (h) a power mode of the second device, or (i) an indication from the second device. The component 198 may also be configured to output an LDPC coded transmission to the second device based on the selected base graph. The component 198 may be within the cellular baseband processor 1424, the application processor 1406, or both the cellular baseband processor 1424 and the application processor 1406. The component 198 may be one or more hardware components specifically configured to carry out the stated processes/algorithm, implemented by one or more processors configured to perform the stated processes/algorithm, stored within a computer-readable medium for implementation by one or more processors, or some combination thereof. As shown, the apparatus 1404 may include a variety of components configured for various functions. In one configuration, the apparatus 1404, and in particular the cellular baseband processor 1424 and/or the application processor 1406, includes means for selecting a base graph from a plurality of base graphs based on one or more of (a) a decoding complexity of a second device, (b) a device category of the second device, (c) a capability of the second device, (d) a decoder mode of the second device, (e) a receiver complexity of the second device, (f) a receiver mode of the second device, (g) a power consumption of the second device, (h) a power mode of the second device, or (i) an indication from the second device, means for outputting an LDPC coded transmission to the second device based on the selected base graph, means for obtaining a CQI report for multiple base graphs, means for outputting a configuration for the second device to use (a) the first level of the decoding complexity or the first receiver mode when the second device is configured with a first number of frequency bands or CCs that are larger than a threshold, or (b) the second level of the decoding complexity or the second receiver mode when the second device is configured with a second number of frequency bands or CCs that are smaller than the threshold, or means for comparing a throughput to a threshold of a reference measurement channel based on a reference sensitivity power level. The means may be the component 198 of the apparatus 1404 configured to perform the functions recited by the means. As described supra, the apparatus 1404 may include the Tx processor 368, the Rx processor 356, and the controller/processor 359. As such, in one configuration, the means may be the Tx processor 368, the Rx processor 356, and/or the controller/processor 359 configured to perform the functions recited by the means.

As discussed supra, the component 199 may be configured to select a base graph from a plurality of base graphs based on one or more of (a) a decoding complexity of the second device, (b) a device category of the second device, (c) a capability of the second device, (d) a decoder mode of the second device, (e) a receiver complexity of the second device, (f) a receiver mode of the second device, (g) a power consumption of the second device, (h) a power mode of the second device, (i) an indication from the second device, (j) a first bandwidth of a CC, or (k) a second bandwidth of a transmission. The component 199 may be further configured to receive an LDPC coded transmission from a first device based on the selected base graph. The component 199 may be within one or more processors of one or more of the CU 1510, DU 1530, and the RU 1540. The component 199 may be one or more hardware components specifically configured to carry out the stated processes/algorithm, implemented by one or more processors configured to perform the stated processes/algorithm, stored within a computer-readable medium for implementation by one or more processors, or some combination thereof. The network entity 1502 may include a variety of components configured for various functions. In one configuration, the network entity 1502 includes means for selecting a base graph from a plurality of base graphs based on one or more of (a) a decoding complexity of the second device, (b) a device category of the second device, (c) a capability of the second device, (d) a decoder mode of the second device, (e) a receiver complexity of the second device, (f) a receiver mode of the second device, (g) a power consumption of the second device, (h) a power mode of the second device, (i) an indication from the second device, (j) a first bandwidth of a CC, or (k) a second bandwidth of a transmission, means for receiving an LDPC coded transmission from a first device based on the selected base graph, means for transmitting the indication, means for switching the decoder mode or the power mode, means for transmitting a CQI report for multiple base graphs to the first device, means for transmitting the indication to the first device, means for receiving a configuration from the first device to use (a) the first level of the decoding complexity or the first receiver mode when the second device is configured with a first number of frequency bands or CCs that are larger than a threshold, or (b) the second level of the decoding complexity or the second receiver mode when the second device is configured with a second number of frequency bands or CCs that are smaller than the threshold, or means for comparing a throughput to a threshold of a reference measurement channel based on a reference sensitivity power level. The means may be the component 199 of the apparatus 1404 configured to perform the functions recited by the means. As described supra, the apparatus 1404 may include the Tx processor 368, the Rx processor 356, and the controller/processor 359. As such, in one configuration, the means may be the Tx processor 368, the Rx processor 356, and/or the controller/processor 359 configured to perform the functions recited by the means.

Figure 15:
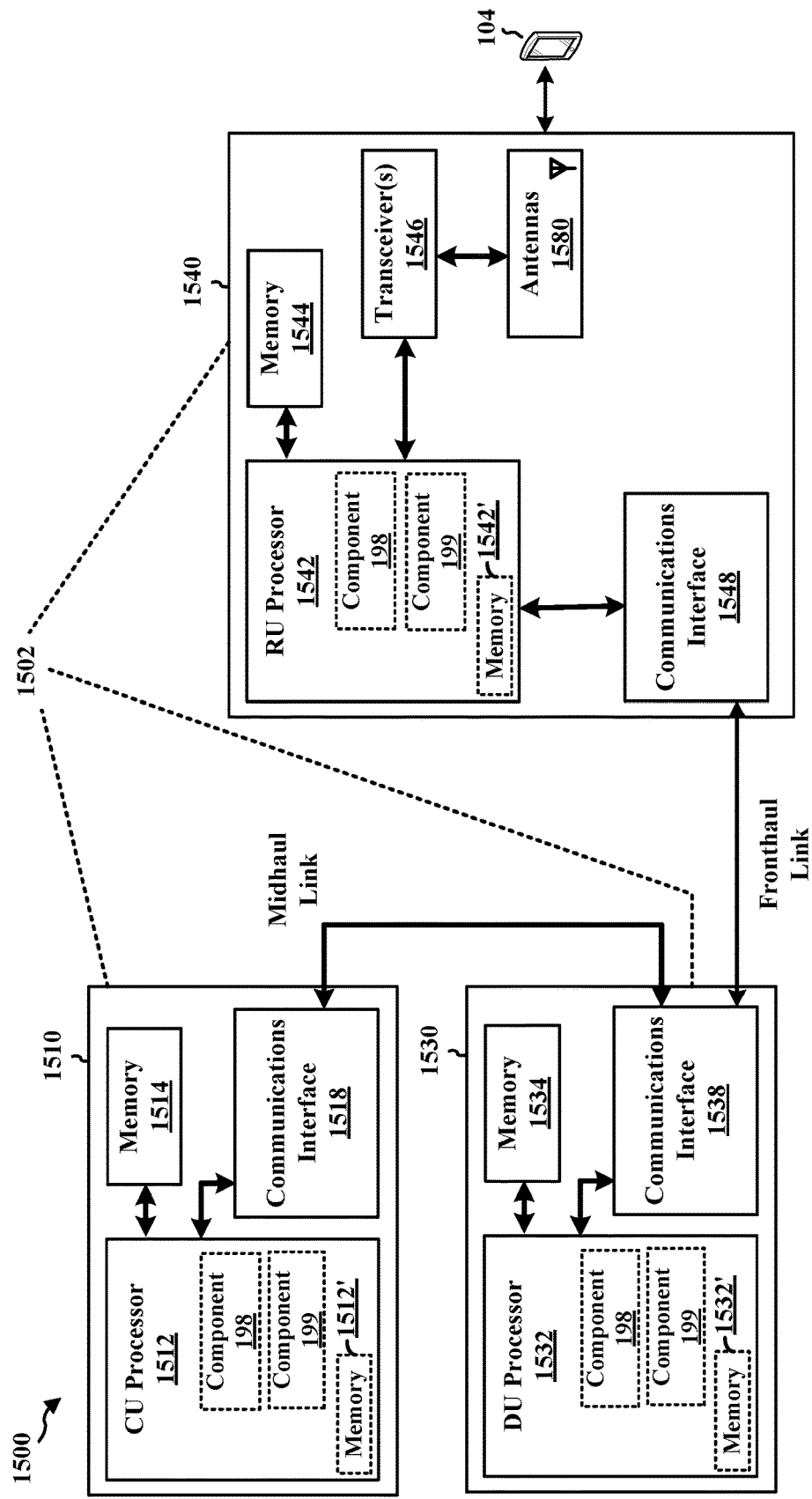
FIG. 15 is a diagram illustrating an example of a hardware implementation for an example network entity.

FIG. 15 is a diagram 1500 illustrating an example of a hardware implementation for a network entity 1502. The network entity 1502 may be a BS, a component of a BS, or may implement BS functionality. The network entity 1502 may include at least one of a CU 1510, a DU 1530, or an RU 1540. For example, depending on the layer functionality handled by the component 199, the network entity 1502 may include the CU 1510; both the CU 1510 and the DU 1530; each of the CU 1510, the DU 1530, and the RU 1540; the DU 1530; both the DU 1530 and the RU 1540; or the RU 1540. The CU 1510 may include a CU processor 1512. The CU processor 1512 may include on-chip memory 1512'. In some aspects, the CU 1510 may further include additional memory modules 1514 and a communications interface 1518. The CU 1510 communicates with the DU 1530 through a midhaul link, such as an F1 interface. The DU 1530 may include a DU processor 1532. The DU processor 1532 may include on-chip memory 1532'. In some aspects, the DU 1530 may further include additional memory modules 1534 and a communications interface 1538. The DU 1530 communicates with the RU 1540 through a fronthaul link. The RU 1540 may include an RU processor 1542. The RU processor 1542 may include on-chip memory 1542'. In some aspects, the RU 1540 may further include additional memory modules 1544, one or more transceivers 1546, antennas 1580, and a communications interface 1548. The RU 1540 communicates with the UE 104. The on-chip memory 1512', 1532', 1542' and the additional memory modules 1514, 1534, 1544 may each be considered a computer-readable medium/memory. Each computer-readable medium/memory may be non-transitory. Each of the processors 1512, 1532, 1542 is responsible for general processing, including the execution of software stored on the computer-readable medium/memory. The software, when executed by the corresponding processor(s) causes the processor(s) to perform the various functions described supra. The computer-readable medium/memory may also be used for storing data that is manipulated by the processor(s) when executing software.

As discussed supra, the component 198 is configured to select a base graph from a plurality of base graphs based on one or more of (a) a decoding complexity of a second device, (b) a device category of the second device, (c) a capability of the second device, (d) a decoder mode of the second device, (e) a receiver complexity of the second device, (f) a receiver mode of the second device, (g) a power consumption of the second device, (h) a power mode of the second device, or (i) an indication from the second device. The component 198 may also be configured to output an LDPC coded transmission to the second device based on the selected base graph. The component 198 may be within the cellular baseband processor 1424, the application processor 1406, or both the cellular baseband processor 1424 and the application processor 1406. The component 198 may be one or more hardware components specifically configured to carry out the stated processes/algorithm, implemented by one or more processors configured to perform the stated processes/algorithm, stored within a computer-readable medium for implementation by one or more processors, or some combination thereof. As shown, the apparatus 1404 may include a variety of components configured for various functions. In one configuration, the apparatus 1404, and in particular the cellular baseband processor 1424 and/or the application processor 1406, includes means for selecting a base graph from a plurality of base graphs based on one or more of (a) a decoding complexity of a second device, (b) a device category of the second device, (c) a capability of the second device, (d) a decoder mode of the second device, (e) a receiver complexity of the second device, (f) a receiver mode of the second device, (g) a power consumption of the second device, (h) a power mode of the second device, or (i) an indication from the second device, means for outputting an LDPC coded transmission to the second device based on the selected base graph, means for obtaining a CQI report for multiple base graphs, means for outputting a configuration for the second device to use (a) the first level of the decoding complexity or the first receiver mode when the second device is configured with a first number of frequency bands or CCs that are larger than a threshold, or (b) the second level of the decoding complexity or the second receiver mode when the second device is configured with a second number of frequency bands or CCs that are smaller than the threshold, or means for comparing a throughput to a threshold of a reference measurement channel based on a reference sensitivity power level. The means may be the component 198 of the network entity 1502 configured to perform the functions recited by the means. As described supra, the network entity 1502 may include the Tx processor 316, the Rx processor 370, and the controller/processor 375. As such, in one configuration, the means may be the Tx processor 316, the Rx processor 370, and/or the controller/processor 375 configured to perform the functions recited by the means.

As discussed supra, the component 199 may be configured to select a base graph from a plurality of base graphs based on one or more of (a) a decoding complexity of the second device, (b) a device category of the second device, (c) a capability of the second device, (d) a decoder mode of the second device, (e) a receiver complexity of the second device, (f) a receiver mode of the second device, (g) a power consumption of the second device, (h) a power mode of the second device, (i) an indication from the second device, (j) a first bandwidth of a CC, or (k) a second bandwidth of a transmission. The component 199 may be further configured to receive an LDPC coded transmission from a first device based on the selected base graph. The component 199 may be within one or more processors of one or more of the CU 1510, DU 1530, and the RU 1540. The component 199 may be one or more hardware components specifically configured to carry out the stated processes/algorithm, implemented by one or more processors configured to perform the stated processes/algorithm, stored within a computer-readable medium for implementation by one or more processors, or some combination thereof. The network entity 1502 may include a variety of components configured for various functions. In one configuration, the network entity 1502 includes means for selecting a base graph from a plurality of base graphs based on one or more of (a) a decoding complexity of the second device, (b) a device category of the second device, (c) a capability of the second device, (d) a decoder mode of the second device, (e) a receiver complexity of the second device, (f) a receiver mode of the second device, (g) a power consumption of the second device, (h) a power mode of the second device, (i) an indication from the second device, (j) a first bandwidth of a CC, or (k) a second bandwidth of a transmission, means for receiving an LDPC coded transmission from a first device based on the selected base graph, means for transmitting the indication, means for switching the decoder mode or the power mode, means for transmitting a CQI report for multiple base graphs to the first device, means for transmitting the indication to the first device, means for receiving a configuration from the first device to use (a) the first level of the decoding complexity or the first receiver mode when the second device is configured with a first number of frequency bands or CCs that are larger than a threshold, or (b) the second level of the decoding complexity or the second receiver mode when the second device is configured with a second number of frequency bands or CCs that are smaller than the threshold, or means for comparing a throughput to a threshold of a reference measurement channel based on a reference sensitivity power level. The means may be the component 199 of the network entity 1502 configured to perform the functions recited by the means. As described supra, the network entity 1502 may include the Tx processor 316, the Rx processor 370, and the controller/processor 375. As such, in one configuration, the means may be the Tx processor 316, the Rx processor 370, and/or the controller/processor 375 configured to perform the functions recited by the means.

It is understood that the specific order or hierarchy of blocks in the processes/flowcharts disclosed is an illustration of example approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not limited to the aspects described herein, but are to be accorded the full scope consistent with the language claims. Reference to an element in the singular does not mean "one and only one" unless specifically so stated, but rather "one or more." Terms such as "if," "when," and "while" do not imply an immediate temporal relationship or reaction. That is, these phrases, e.g., "when," do not imply an immediate action in response to or during the occurrence of an action, but simply imply that if a condition is met then an action will occur, but without requiring a specific or immediate time constraint for the action to occur. The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. Sets should be interpreted as a set of elements where the elements number one or more. Accordingly, for a set of X, X would include one or more elements. If a first apparatus receives data from or transmits data to a second apparatus, the data may be received/transmitted directly between the first and second apparatuses, or indirectly between the first and second apparatuses through a set of apparatuses. All structural and functional equivalents to the elements of the various aspects described throughout this disclosure that are known or later come to be known to those of ordinary skill in the art are expressly incorporated herein by reference and are encompassed by the claims. Moreover, nothing disclosed herein is dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

As used herein, the phrase "based on" shall not be construed as a reference to a closed set of information, one or more conditions, one or more factors, or the like. In other words, the phrase "based on A" (where "A" may be information, a condition, a factor, or the like) shall be construed as "based at least on A" unless specifically recited differently.

A device configured to "output" data, such as a transmission, signal, or message, may transmit the data, for example with a transceiver, or may send the data to a device that transmits the data. A device configured to "obtain" data, such as a transmission, signal, or message, may receive, for example with a transceiver, or may obtain the data from a device that receives the data.

The following aspects are illustrative only and may be combined with other aspects or teachings described herein, without limitation.

Aspect 1 is a method of wireless communication at a first device, where the method may include selecting a base graph from a plurality of base graphs based information associated with a second device. The method may further include outputting an LDPC coded transmission to the second device based on the selected base graph.

Aspect 2 is the method of aspect 1, where the base graph may be selected based on the decoding complexity of the second device. The decoding complexity of the second device may include one or more of (a) a number of code blocks per transport block, (b) an MCS, (c) a modulation order, (d) a number of layers for a transmission, (e) a direction of communication being uplink, downlink, or sidelink, (f) a limited buffer rate matching being enabled for a transport block, (g) a maximum number of MIMO layers that are configured on a CC, (h) a highest modulation order configured in the CC, (i), a first bandwidth of the CC, or (j), a second bandwidth of the transmission.

Aspect 3 is the method of aspect 2, where the base graph may be selected based on one or more of (a) the number of code blocks per transport block, (b) the MCS, (c) the modulation order, (d) the number of layers for the transmission, (e) a transport block size, (f) the first bandwidth of the CC, or (g) the second bandwidth of the transmission being above a threshold.

Aspect 4 is the method of any of aspects 1 to 3, where the indication may indicate a base graph preference. The base graph may be selected based at least on the indication from the second device.

Aspect 5 is the method of any of aspects 1 to 4, where the indication may indicate a decoder information associated with the second device. The base graph may be selected based at least on the indication from the second device.

Aspect 6 is the method of aspect 5, where the decoder information may indicate at least one of (a) the decoder mode of the second device, (b) the power mode of the second device, (c) an amount of decoder iterations at the second device, or (d) a number of bits for LLR quantization at the second device.

Aspect 7 is the method of any of aspects 1 to 6, where the method may further include obtaining a CQI report for multiple base graphs. The base graph may be selected based on the CQI report.

Aspect 8 is the method of any of aspects 1 to 7, where the indication may indicate support for a first capability for a first base graph associated with a first level of the decoding complexity or a first receiver mode. The indication may indicate support for a second capability for a second base graph associated with a second level of the decoding complexity or a second receiver mode. The base graph may be selected from a group including the first base graph and the second base graph.

Aspect 9 is the method of any of aspects 1 to 8, where the method may further include outputting a configuration for the second device to use (a) the first level of the decoding complexity or the first receiver mode when the second device is configured with a first number of frequency bands or CCs that are larger than a threshold, or (b) the second level of the decoding complexity or the second receiver mode when the second device is configured with a second number of frequency bands or CCs that are smaller than the threshold.

Aspect 10 is the method of any of aspects 1 to 9, where the method may further include comparing a throughput to a threshold of a reference measurement channel based on a reference sensitivity power level. The reference sensitivity power level for lower complexity decoding may be higher than for higher complexity decoding. The base graph may be selected based at least on a result of comparing the throughput to the threshold.

Aspect 11 is the method of any of aspects 1 to 10, where the plurality of base graphs may include at least a first base graph and a second base graph. The first base graph may have one or more of (a) a higher performance than the second base graph when a number of iterations is below a first threshold, (b) the higher performance than the second base graph when the number of iterations is below the first threshold and a lower performance than the second base graph when the number of iterations is above a second threshold, (c) a first code instance generated based on the first base graph that has a higher level of performance than a second code instance generated based on the second base graph when decoded using a reduced amount of iterations or a reduced number of quantization bits, or (d) support for a higher maximum coding rate or a higher minimum coding rate than the second base graph.

Aspect 12 is the method of any of aspects 1 to 11, where at least one of (a) the first device includes a network entity and the second device includes a UE, (b) the first device includes a first UE and the second device includes a second UE, or (c) the first device includes the UE and the second device includes the network entity.

Aspect 13 is a method of wireless communication at a second device, where the method may include selecting a base graph from a plurality of base graphs based on information associated with the second device. The method may further include receiving an LDPC coded transmission from a first device based on the selected base graph.

Aspect 14 is the method of aspect 13, where the base graph may be selected based on the decoding complexity of the second device. The decoding complexity of the second device may include one or more of (a) a number of code blocks per transport block, (b) an MCS, (c) a modulation order, (d) a number of layers for a transmission, (e) a direction of communication being uplink, downlink, or sidelink, (f) a limited buffer rate matching being enabled for a transport block, (g) a maximum number of MIMO layers that are configured on a CC, (h) a highest modulation order configured in the CC, (i), a first bandwidth of the CC, or (j), a second bandwidth of the transmission.

Aspect 15 is the method of aspect 14, where the base graph may be selected based on one or more of the number of (a) code blocks per transport block, (b) the MCS, (c) the modulation order, (d) a transport block size, (e) the first bandwidth of the CC, (f) the second bandwidth of the transmission, or (g) the number of layers for the transmission being above a threshold.

Aspect 16 is the method of any of aspects 13-15, where the method may further include transmitting the indication. The indication may indicate a base graph preference. The base graph may be selected based at least on the indication.

Aspect 17 is the method of any of aspects 13-16, where the method may further include switching the decoder mode or the power mode. The method may further include transmitting the indication. The indication may indicate a decoder information associated with the second device. The base graph may be selected based at least on the indication.

Aspect 18 is the method of aspect 17, where the decoder information may indicate at least one of (a) the decoder mode of the second device, (b) the power mode of the second device, (c) an amount of decoder iterations at the second device, or (d) a number of bits for LLR quantization at the second device.

Aspect 19 is the method of any of aspects 13-18, where the method may further include transmitting a CQI report for multiple base graphs to the first device. The base graph may be selected based on the CQI report.

Aspect 20 is the method of any of aspects 13-19, where the method may further include transmitting the indication to the first device. The indication may indicate support for a first capability for a first base graph associated with a first level of the decoding complexity or a first receiver mode and for a second capability for a second base graph associated with a second level of the decoding complexity or a second receiver mode. The plurality of base graphs may include the first base graph and the second base graph.

Aspect 21 is the method of aspect 20, where the method may further include receiving a configuration from the first device to use (a) the first level of the decoding complexity or the first receiver mode when the second device is configured with a first number of frequency bands or CCs that are larger than a threshold, or (b) the second level of the decoding complexity or the second receiver mode when the second device is configured with a second number of frequency bands or CCs that are smaller than the threshold.

Aspect 22 is the method of any of aspects 13-21, where the method may further include comparing a throughput to a threshold of a reference measurement channel based on a reference sensitivity power level. The reference sensitivity power level for lower complexity decoding may be higher than for higher complexity decoding.

Aspect 23 is the method of any of aspects 13-22, where the plurality of base graphs may include at least a first base graph and a second base graph. The first base graph may have one or more of (a) a higher performance than the second base graph when a number of iterations is below a first threshold, (b) the higher performance than the second base graph when the number of iterations is below the first threshold and a lower performance than the second base graph when the number of iterations is above a second threshold, (c) a first code instance generated based on the first base graph that has a higher level of performance than a second code instance generated based on the second base graph when decoded using a reduced amount of iterations or a reduced number of quantization bits, or (d) support for a higher maximum coding rate or a higher minimum coding rate than the second base graph.

Aspect 24 is the method of any of aspects 13-23, where at least one of (a) the first device includes a network entity and the second device includes a UE, (b) the first device includes a first UE and the second device includes a second UE, or (c) the first device includes the UE and the second device includes the network entity.

Aspect 25 is the method of any of aspects 1-14, where the information associated with the second device may include at least one of (a) a decoding complexity of a second device, (b) a device category of the second device, (c) a capability of the second device, (d) a decoder mode of the second device, (e) a receiver complexity of the second device, (f) a receiver mode of the second device, (g) a power consumption of the second device, (h) a power mode of the second device, or (i) an indication from the second device.

Aspect 26 an apparatus for wireless communication, including: a memory; and at least one processor coupled to the memory and, based at least in part on information stored in the memory, the at least one processor is configured to implement any of aspects 1 to 25.

Aspect 27 is the apparatus of aspect 26, further including at least one of an antenna or a transceiver coupled to the at least one processor.

Aspect 28 is an apparatus for wireless communication including means for implementing any of aspects 1 to 25.

Aspect 29 is a computer-readable medium (e.g., a non-transitory computer-readable medium) storing computer executable code, where the code when executed by a processor causes the processor to implement any of aspects 1 to 25.

What is claimed is:

1. An apparatus for wireless communication at a first device, comprising:
   at least one memory; and
   at least one processor coupled to the at least one memory and, based at least in part on information stored in the at least one memory, the at least one processor is configured to cause the first device to:
      select a base graph from a plurality of base graphs based on a set of configuration parameters associated with a second device; and
      output a low density parity check (LDPC) coded transmission to the second device based on the selected base graph.

2. The apparatus of claim 1, wherein, to select the base graph from the plurality of base graphs based on the set of configuration parameters associated with the second device, the at least one processor is configured to cause the first device to select the base graph from the plurality of base graphs based on a decoding complexity of the second device, wherein the decoding complexity includes at least one of:
   a modulation and coding scheme (MCS),
   a modulation order,
   a number of layers for a transmission,
   a direction of communication being uplink, downlink, or sidelink,
   a limited buffer rate matching being enabled for a transport block, a maximum number of multiple-output (MIMO) layers that are configured on a component carrier (CC),
a highest modulation order configured in the CC,
a first bandwidth of the CC, or
a second bandwidth of the transmission.

3. The apparatus of claim 2, wherein, to select the base graph from the plurality of base graphs based on the set of configuration parameters associated with the second device, the at least one processor is configured to cause the first device to select the base graph from the plurality of base graphs based on at least one of:
a number of code blocks per transport block,
the MCS, the modulation order,
the number of layers for the transmission,
the first bandwidth of the CC, or
the second bandwidth of the transmission being above a threshold.

4. The apparatus of claim 1, wherein an indication associated from the second device indicates a base graph preference, and wherein, to select the base graph from the plurality of base graphs based on the set of configuration parameters associated with the second device, the at least one processor is configured to cause the first device to select the base graph from the plurality of base graphs based at least on the indication from the second device.

5. The apparatus of claim 1, wherein the at least one processor is further configured to cause the first device to:
receive an indication from the second device that indicates a decoder information associated with the second device, wherein, to select the base graph from the plurality of base graphs based on the set of configuration parameters associated with the second device, the at least one processor is configured to select the base graph from the plurality of base graphs based at least on the indication from the second device.

6. The apparatus of claim 5, wherein the decoder information indicates at least one of:
a power mode of the second device,
an amount of decoder iterations at the second device, or
a number of bits for log likelihood ratio (LLR) quantization at the second device.

7. The apparatus of claim 1, further comprising a transceiver coupled to the at least one processor, wherein the at least one processor is further configured to cause the first device to:
obtain, via the transceiver, a channel quality indicator (CQI) report for multiple base graphs, wherein, to select the base graph from the plurality of base graphs based on the set of configuration parameters associated with the second device, the at least one processor is configured to select the base graph from the plurality of base graphs based on the CQI report.

8. The apparatus of claim 1, wherein the at least one processor is further configured to cause the first device to:
receive an indication from the second device that indicates support for a first capability for a first base graph associated with a first level of a decoding complexity of the second device, wherein the decoding complexity comprises (a) a power mode of the second device, (b) an amount of decoder iterations at the second device, or (c) a number of bits for log likelihood ratio (LLR) quantization at the second device, and indicates support for a second capability for a second base graph associated with a second level of the decoding complexity, and wherein, to select the base graph from the plurality of base graphs based on the set of configuration parameters associated with the second device, the at least one processor is configured to cause the first device to select the base graph from a group of base graphs including the first base graph and the second base graph.

9. The apparatus of claim 8, wherein the at least one processor is further configured to cause the first device to:
output a configuration for the second device to use:
the first level of the decoding complexity when the second device is configured with a first number of frequency bands or component carriers (CCs) that are larger than a threshold, or
the second level of the decoding complexity when the second device is configured with a second number of frequency bands or CCs that are smaller than the threshold.

10. The apparatus of claim 1, wherein the at least one processor is further configured to cause the first device to:
compare a throughput to a threshold of a reference measurement channel based on a reference sensitivity power level, wherein the reference sensitivity power level for lower complexity decoding is higher than for higher complexity decoding, and wherein, to select the base graph from the plurality of base graphs based on the set of configuration parameters associated with the second device, the at least one processor is configured to select the base graph from the plurality of base graphs based at least on a result of comparing the throughput to the threshold.

11. The apparatus of claim 1, wherein the plurality of base graphs comprises at least a first base graph and a second base graph, the first base graph having one or more of:
a higher performance than the second base graph when a number of iterations is below a first threshold,
the higher performance than the second base graph when the number of iterations is below the first threshold and a lower performance than the second base graph when the number of iterations is above a second threshold,
a first code instance generated based on the first base graph that has a higher level of performance than a second code instance generated based on the second base graph when decoded using a reduced amount of iterations or a reduced number of quantization bits, or
support for a higher maximum coding rate or a higher minimum coding rate than the second base graph.

12. The apparatus of claim 1, wherein at least one of:
the first device comprises a network entity and the second device comprises a user equipment (UE),
the first device comprises a first UE and the second device comprises a second UE, or
the first device comprises the UE and the second device comprises the network entity.

13. The apparatus of claim 1, wherein the set of configuration parameters associated with the second device comprises at least one of:
a number of decoding iterations of the second device,
a device category of the second device,
a capability of the second device,
a power consumption of the second device,
a power mode of the second device, or
an indication from the second device.

14. An apparatus for wireless communication at a second device, comprising:
at least one memory; and
at least one processor coupled to the at least one memory and, based at least in part on information stored in the at least one memory, the at least one processor is configured to cause the second device to:

select a base graph from a plurality of base graphs based on a set of configuration parameters associated with the second device; and receive a low density parity check (LDPC) coded transmission from a first device based on the selected base graph.

15. The apparatus of claim 14, wherein, to select the base graph from the plurality of base graphs based on the set of configuration parameters associated with the second device, the at least one processor is configured to cause the second device to select the base graph from the plurality of base graphs based on a decoding complexity of the second device, wherein the decoding complexity includes at least one of:
a modulation and coding scheme (MCS),
a modulation order,
a number of layers for a transmission,
a direction of communication being uplink, downlink, or sidelink,
a limited buffer rate matching being enabled for a transport block,
a maximum number of multiple-output (MIMO) layers that are configured on a component carrier (CC), or
a highest modulation order configured in the CC.

16. The apparatus of claim 15, wherein, to select the base graph from the plurality of base graphs based on the set of configuration parameters associated with the second device, the at least one processor is configured to cause the second device to select the base graph from the plurality of base graphs based on one or more of:
a number of code blocks per transport block;
the MCS, the modulation order;
a transport block size;
a first bandwidth of the CC;
a second bandwidth of the transmission; or
the number of layers for the transmission being above a threshold.

17. The apparatus of claim 14, further comprising a transceiver coupled to the at least one processor, wherein the at least one processor is further configured to cause the second device to:
transmit an indication of the second device using the transceiver, wherein the indication indicates a base graph preference, wherein, to select the base graph from the plurality of base graphs based on the set of configuration parameters associated with the second device, the at least one processor is configured to select the base graph from the plurality of base graphs based at least on the indication.

18. The apparatus of claim 14, wherein the at least one processor is further configured to cause the second device to:
switch a decoder mode of the second device or a power mode of the second device; and
transmit an indication of the second device, wherein the indication indicates a decoder information associated with the second device, and wherein, to select the base graph from the plurality of base graphs based on the set of configuration parameters associated with the second device, the at least one processor is configured to select the base graph from the plurality of base graphs at least on the indication.

19. The apparatus of claim 18, wherein the decoder information indicates at least one of:
the power mode of the second device,
an amount of decoder iterations at the second device, or
a quantity of bits for log likelihood ratio (LLR) quantization at the second device.

20. The apparatus of claim 14, wherein the at least one processor is further configured to cause the second device to:
transmit a channel quality indicator (CQI) report for multiple base graphs to the first device, wherein, to select the base graph from the plurality of base graphs based on the set of configuration parameters associated with the second device, the at least one processor is configured to select the base graph from the plurality of base graphs on the CQI report.

21. The apparatus of claim 14, wherein the at least one processor is further configured to cause the second device to:
transmit an indication of the second device to the first device, wherein the indication indicates support for a first capability for a first base graph associated with a first level of a decoding complexity at the second device, wherein the decoding complexity comprises (a) a power mode of the second device, (b) an amount of decoder iterations at the second device, or (c) a number of bits for log likelihood ratio (LLR) quantization at the second device, and for a second capability for a second base graph associated with a second level of the decoding complexity, wherein the plurality of base graphs comprises the first base graph and the second base graph.

22. The apparatus of claim 21, wherein the at least one processor is further configured to cause the second device to:
receive a configuration from the first device to use:
the first level of the decoding complexity when the second device is configured with a first number of frequency bands or component carriers (CCs) that are larger than a threshold, or
the second level of the decoding complexity when the second device is configured with a second number of frequency bands or CCs that are smaller than the threshold.

23. The apparatus of claim 14, wherein the at least one processor is further configured to cause the second device to:
compare a throughput to a threshold of a reference measurement channel based on a reference sensitivity power level, wherein the reference sensitivity power level for lower complexity decoding is higher than for higher complexity decoding.

24. The apparatus of claim 14, wherein the plurality of base graphs comprises at least a first base graph and a second base graph, the first base graph having one or more of:
a higher performance than the second base graph when a number of iterations is below a first threshold,
the higher performance than the second base graph when the number of iterations is below the first threshold and a lower performance than the second base graph when the number of iterations is above a second threshold,
a first code instance generated based on the first base graph that has a higher level of performance than a second code instance generated based on the second base graph when decoded using a reduced amount of iterations or a reduced number of quantization bits, or
support for a higher maximum coding rate or a higher minimum coding rate than the second base graph.

25. The apparatus of claim 14, wherein at least one of:
the first device comprises a network entity and the second device comprises a user equipment (UE),
the first device comprises a first UE and the second device comprises a second UE, or
the first device comprises the UE and the second device comprises the network entity.

26. The apparatus of claim 14, wherein the set of configuration parameters associated with the second device comprises at least one of:
- a number of decoding iterations at the second device,
- a device category of the second device,
- a capability of the second device,
- a power consumption of the second device,
- a power mode of the second device,
- an indication of the second device,
- a first bandwidth of a component carrier (CC), or
- a second bandwidth of a transmission.

27. A method of wireless communication at a first device, comprising:
- selecting a base graph from a plurality of base graphs based on a set of configuration parameters associated with a second device; and
- outputting a low density parity check (LDPC) coded transmission to the second device based on the selected base graph.

28. The method of claim 27, further comprising:
- comparing a throughput to a threshold of a reference measurement channel based on a reference sensitivity power level, wherein the reference sensitivity power level for lower complexity decoding is higher than for higher complexity decoding, wherein selecting the base graph from the plurality of base graphs based on the set of configuration parameters associated with the second device comprises selecting the base graph from the plurality of base graphs based at least on a result of comparing the throughput to the threshold.

29. A method of wireless communication at a second device, comprising:
- selecting a base graph from a plurality of base graphs based on a set of configuration parameters associated with the second device; and
- receiving a low density parity check (LDPC) coded transmission from a first device based on the selected base graph.

30. The method of claim 29, further comprising:
- receiving a configuration from the first device to use:
  - a first level of a decoding complexity when the second device is configured with a first number of frequency bands or component carriers (CCs) that is larger than a threshold, or
  - a second level of the decoding complexity when the second device is configured with a second number of frequency bands or CCs that is smaller than the threshold.

* * * * *